United States Patent
Ciesielski et al.

(10) Patent No.: US 7,472,359 B2
(45) Date of Patent: Dec. 30, 2008

(54) BEHAVIORAL TRANSFORMATIONS FOR HARDWARE SYNTHESIS AND CODE OPTIMIZATION BASED ON TAYLOR EXPANSION DIAGRAMS

(75) Inventors: Maciej Ciesielski, Amherst, MA (US);
Serkan Askar, Amherst, MA (US);
Emmanuel Boutillon, Lorient (FR);
Jeremie Guillot, Lorient (FR)

(73) Assignee: University of Massachusetts, Amherst, MA (US)

( * ) Notice: Subject to any disclaimer, the term of this patent is extended or adjusted under 35 U.S.C. 154(b) by 298 days.

(21) Appl. No.: 11/292,493

(22) Filed: Dec. 2, 2005

(65) Prior Publication Data

US 2006/0156260 A1    Jul. 13, 2006

Related U.S. Application Data

(60) Provisional application No. 60/633,025, filed on Dec. 3, 2004.

(51) Int. Cl.
*G06F 17/50* (2006.01)
(52) U.S. Cl. .................... 716/2; 716/7; 716/18
(58) Field of Classification Search .......... 716/2, 716/7, 18
See application file for complete search history.

(56) References Cited

U.S. PATENT DOCUMENTS 6,732,341 B1 *  5/2004  Chang et al. ............... 716/6

2004/0093570 A1 *  5/2004  Jain et al. ............... 716/5

OTHER PUBLICATIONS

Chaiyakul, V; Gajski, D D; and Ramachandran, L; Minimizing Syntatic Variance with Assignment Decision Diagrams; Technical Report #92-34, Apr. 16, 1992; Dept. of Information and Computer Science, University of California, Irvine, 20 pages.

Ganai, M K; Gupta A; Mukaiyama; and Wakabayashi, K; Another Dimension to High Level Synthesis; Verification; *Proceedings of the European Joint Conferences on Theory and Practice of Software—2006; Sixth International Workshop on Designing Correct Circuits* Sheeran, Mary (ed.), 2006, 2 pages.

(Continued)

*Primary Examiner*—Phallaka Kik
(74) *Attorney, Agent, or Firm*—Reinhart Boerner van Deuren s.c.

(57) ABSTRACT

A systematic method and system for behavioral transformations for hardware synthesis and code optimization in software compilation based on Taylor Expansion Diagrams. The system can be integrated with any suitable architectural synthesis system. It can also be built into a compiler tool for general purpose processor or into a specific target compiler. For hardware synthesis, an arithmetic expression of the computation is extracted from the behavioral-level HDL design or directly from its matrix representation, and represented in canonical data structure, called Taylor Expansion Diagram. In architectural synthesis, factorization, common sub-expression extraction and decomposition of the resulting Taylor Expansion Diagram is performed, producing an optimized data flow graph, from which the structural HDL design is obtained using standard architectural synthesis. For software compilation and code optimization, common sub-expression extraction and factorization serve as pre-compilation optimization tasks performed according to the target architecture to generate a new code for the compiler.

35 Claims, 19 Drawing Sheets

OTHER PUBLICATIONS

Ganai, M K; Gupta A; Mukaiyama; and Wakabayashi, K; Another Dimension to High Level Synthesis; Verification; Slide Show, Jan. 31, 2006, NEC Labs America, Princeton, NJ, 20 pages.

Hosangadi, A; Fallah, F and Kastner, R; Common Subexpression Elimination Involving Multiple Variables for Linear DSP Synthesis; 15th Institute of Electrical and Electronics Engineers International Conference on Application-Specific Systems, Architectures and Processors, IEEE Computer Society, 2004., 11 pages.

Hosangadi, A; Fallah, F and Kastner, R; Factoring and Eliminatiing Common Subexpressions in Polynomial Expressions; Institute of Electrical and Electronics Engineers, 2004, 169-174, Nov. 7-11, 2004.

Hosangadi, A; Fallah, F and Kastner, R; Simultaneous Optimization of Delay and Number of Operations in Multiplierless Implementation of Linear Systems. Proceedings of the 14th International Workshop on Logic and Synthesis (IWLS), Lake Arrowhead, CA, Jun. 2005, 8 pages.

Hosangadi, A; Fallah, F and Kastner, R; Optimizing Polynomial Expressions by Algebraic Factorization and Common Subexpression Elimination; Institute of Electrical and Electronics Engineers Transactions on Computer-Aided Design of Integrated Circuits and Systems, Oct. 2006, 2012-2022, 25 (10).

Chandrakasan, A; Potkonjak, M; Mehra, R; Rabaey, J and Brodersen, RW; Optimizing Power Using Transformations; Institute of Electrical and Electronics Engineers Transactions on Computer-Aided Design of Integrated Circuits and Systems, Jan. 1995, 12-31, 14 (1).

Potkonjak, M and Rabaey JM; Maximally and Arbitrarily Fast Implementation of Linear and Feedback Linear Computations; Institute of Electrical and Electronics Engineers Transactions on Computer-Aided Design of Integrated and Systems. Jan. 2000, 30-43, 19 (1).

Potkonjak, M and Rabaey, J; Optimizing Resource Utilization Using Transformations, Institute of Electrical and Electronics Engineers Transactions on Computer-Aided Design of Integrated Circuits and Systems, Mar. 1994, 277-292, 13 (3).

Gupta, S; Dutt, N; Gupta, R; and Nicolau, A; Dynamic Conditional Branch Balancing during the High-level Synthesis of Control-Intensive Designs; Design, Automation and Test in Europe Conference and Exhibition, 2003, 270-275.

Gupta, S, Gupta, R K; Dutt, ND, and Nicolau, A; Coordinated Parallelizing Compiler Optimizations and High-Level Synthesis; ACM Transactions on Design Automation of Electronic Systems, Oct. 2004, 1-31, 9 (4).

Gupta, S; Savoiu, N; Dutt, N; Gupta, R; and Nicolau, A; Using Global Code Motions to Improve the Quality of Results for High Level Synthesis; Institute of Electrical and Electronics Engineers Transactions on Computer-Aided Design of Integrated Circuits and Systems, Feb. 2004, 302-312, 23 (2).

Püschel, M; Moura, JMF; Johnson; JR; Padua, D; Veloso, MM; Singer, BW; Xiong, J; Franchetti, F; Gačić, Voronenko, A; Y; Chen, K; Johnson, RW; and Rizzolo, N; Spiral: Code Generation for DSP Transforms; Proceedings of the Institute of Electrical and Electronics Engineers, Feb. 2005, 232-275, 93 (2).

Lin, YL; Recent Developments in High Level Synthesis; ACM Transaction on Design Automation of Electronic Systems (TODAES), Jan. 1997, 2-21, vol. 2, Issue 1.

Martin, E; Sentieys, O; Dubois, H; and Philippe, JL; Gaut: An Architectural Synthesis Tool For Dedicated Signal Processors: Design Automation Conference, 1993, with EURO-VHDL '93, Proceedings EURO-DAC '93, European, Sep. 20-24, 1993, 14-19.

Peymandoust, A and De Micheli, G; Application of Symbolic Computer Algebra in High-Level Data-Flow Synthesis; Institute of Electrical and Electronics Engineers Transactions on Computer-Aided Design in Integrated Circuits and Systems; Sep. 2003, 1154-1165, 22 (9).

Ciesielski, MJ; Kalla, P; Zeng, Z; and Rouszeyre, B; Taylor Expansion Diagrams; A Compact, Canonical Representation with Applications to Symbolic Verification; Design, Automation and Test in Europe Conference and Exhibition, 2002 Proceedings, 285-289.

Kalla, P; Ciesielski, M; Boutillon, E; and Martin, E; High-Level Design Verification Using Taylor Expansion Diagrams: First Results, High-Level Validation and Test Workshop, 2002, Seventh IEEE International, Oct. 27-29, 2002, 13-17.

Gomez-Prado, D; Ren, O; Askar, S, Ciesielski, M; and Boutillon E; Variable Ordering for Taylor Expansion Diagrams; IEEE International High Level Design Validation and Test Workshop>, HLDVT-04, Nov. 2004, 55-59.

Yang, C and Ciesielski, M; BDS: A BDD-Based Logic Optimization System; Institute of Electrical and Electronics Engineers Transactions on Computer-Aided Design of Integrated Circuits and Systems, Jul. 2002, 866-876, 21 (7).

Aho, A; Sethi, R; and Ullman, JD; Compilers: Principles, Techniques, and Tools, 1986, pp. 290-291, 530-533, 554-559, 584-603, 632-637, 708-711, Pearson Education North Asia Limited, Addison Wesley, Singapore.

De Micheli, G; Synthesis and Optimization of Digital Circuits; 1994, 126-137, McGraw-Hill, Inc., Schaum Division, Hightstown, New Jersey, USA.

Gupta. S; Dutt. N. Gupta, R; and Nicolau, A. Spark: A High-Level Synthesis Framework for Applying Parallelizing Compiler Transformations; VLSI Design, 2003, Proceedings. 16th International Conference on, 461-466.

* cited by examiner $x^2 + 2xy + y^2$
$= x(x+2y) + y \cdot y$ b)

$x^2 + a \cdot xy + b$
$= x(x + a \cdot y) + b$ a)

BEHAVIORAL TRANSFORMATIONS FOR HARDWARE SYNTHESIS AND CODE OPTIMIZATION BASED ON TAYLOR EXPANSION DIAGRAMS

CROSS REFERENCE TO RELATED APPLICATION

This application claims priority of provisional application Ser. No. 60/633,025, which is entitled "Behavioral Synthesis Based On Taylor Expansion Diagrams", and which was filed on Dec. 3, 2004, the entirety of which is hereby incorporated herein by reference.

STATEMENT REGARDING FEDERALLY SPONSORED RESEARCH

The United States Government has certain rights to this invention pursuant to Grant No. CCR 0204146 from the National Science Foundation to the University of Massachusetts.

BACKGROUND OF THE INVENTION

Field of the Invention

The present invention relates generally to the computer-aided design of digital circuitry and software compilation, and more particularly, to a method and system for behavioral transformations for hardware synthesis and code optimization based on Taylor expansion diagrams.

Increasing complexity of integrated circuit (IC) designs, already reaching the level of system on chip (SOC), requires the development of efficient computer-aided design (CAD) software tools for synthesis and verification. Hardware description languages (HDL), such as VHDL, Verilog, and System C, have been developed to facilitate system specification in an abstract way from which the actual hardware can then be synthesized. These high level specifications can raise the level of abstraction from register transfer level (RTL) descriptions, typically used by IC designers, to algorithmic and behavioral levels, required by system designers. Working on higher levels of design specification enables the designers to deal with system behaviors and algorithms rather than specific hardware structures. Furthermore, algorithmic descriptions are several orders of magnitude less voluminous than their RTL equivalents, significantly reducing the amount of time needed to specify, verify and debug the system. However, the synthesis tools that deal with compiling those high level descriptions onto hardware did not keep the pace with the development of design specification languages and standards.

Traditional high-level synthesis tools capture HDL models of the hardware and map them into and data flow graphs (DFG). The ensuing optimization steps involve scheduling, resource allocation, pipelining, retiming, and control synthesis as disclosed by G. DeMicheli, in *Synthesis and Optimization of Digital Circuits,* McGraw-Hill, 94. The first two steps are typically known as high-level, or architectural synthesis, and deal with the structural implementation of the data flow graph (DFG), extracted from HDL specification. The remaining steps deal with the optimization and implementation of the control part of the system. The role of scheduling is to divide the computation into sequential steps and assign them to clock cycles of the processor. This is followed by the allocation and binding of the scheduled operators to the available hardware resources, such as adders, multipliers, shifters, etc. A vast literature has been written on the subject during last two decades, covering all aspects of high-level synthesis. A thorough review of high-level synthesis methods can be found in Y-L. Lin, "Recent Developments in High-Level Synthesis," ACM *Transactions on Design of Electronic Systems,* pp. 2-21, 1997 and in several books [see references 1, 3, 4, 5, 6 in the list of References provided below]. Several attempts have been made to combine the different phases of high-level synthesis and apply them in the context of power minimization and layout level design.

The major deficiency of current traditional high-level synthesis methods is that they rely on a fixed unscheduled data flow graph (DFG), extracted directly from the high level specification by a one-to-one mapping. These methods do not modify the extracted DFGs and often rely on designer's directives to efficiently map datapaths onto arithmetic units. This seriously limits the scope of the architectural optimization that uses DFG as their starting point.

Several attempts have been made to provide the optimizing transformations on behavioral level that would modify the DFG prior to hardware mapping. See, for example, references 7, 8, 9, 10, 11, 12 and 13, in the list of References provided below. These techniques, originally used by optimizing compilers, rely on the application of basic algebraic properties, such as associativity, commutativity and distributivity, which are applied as transformation rules. See, for example, J. D. Ullman, Compilers: Principles, Techniques and Tools, Addison-Wesley, 1986. However, these transformations are applied in a manner that does not offer a systematic way to derive optimum flow graphs. The quality of the resulting solutions strongly depends on the type of rules and the order in which they are applied to a particular problem, and in this sense they can be considered as ad hoc methods.

There have been several approaches to simplify arithmetic expressions resulting from Digital Signal Processing (DSP) applications. They use dominator trees and code motion speculation techniques during the scheduling step in high-level synthesis [ref 27, Gupta et al. 2002]. Others perform factorization by using mathematical properties of DSP transforms [ref 25, 26]. SPIRAL [ref 26, Pushel, et al., 2005] is a code generator system that automatically generates optimized implementation of linear signal processing systems, such as DFT (Discrete Fourier Transform), DCT (Discrete Cosine transformation), etc. Its optimization tool is made around mathematical framework that finds the implementation by using manipulation and specific breakdown rules on the given transform. This tool works with parameters and keywords as input and is not able to generate the optimized code on design specifications other than pre-stored transforms.

A recently proposed SymSyn system disclosed by A. Peymandoust and G. DeMicheli, in "Application of Symbolic Computer Algebra in High-Level Data-Flow Synthesis," *IEEE Trans. on Computer-Aided Design,* vol. 22, no. 9, pp. 1154-1165, September 2003, uses symbolic polynomial manipulation techniques to automate mapping of portions of data path onto complex arithmetic blocks. In this approach, the basic HDL modules are converted to their polynomial representations and symbolic algebra methods are used for matching them against library elements. Despite its mathematical elegance, the method does not offer a systematic way to deal with behavioral transformations, such as tree height reduction and tree balancing. Specifically, the decomposition using the SymSyn tool is guided by a selection of side-relations, polynomial expressions that describes functionality of the available library components. The tool uses commercial symbolic algebra software, such as Maple software developed by Maplesoft, a division of Waterloo Maple Inc., Waterloo Ontario Canada, and Mathematica software developed by Wolfram Research Inc., Champaign Ill., 61820, to perform simplification modulo polynomial and requires explicit specification of the side relations to facilitate the simplification. While this works well for mapping onto a specific hardware library, it does not solve a more general problem of finding the best architecture for a given optimization goal (such as minimizing the amount of hardware, or computation latency, power, etc.). In fact, to date, no systematic method for DFG modification for the purpose of behavioral optimization and synthesis have been proposed.

A review of the theory of Taylor Expansion Diagrams (TED) that forms a basis for the presented invention is provided in references [17] [18] and [24], while the application of Taylor Expansion Diagrams to algorithmic verification is discussed in reference [19], in the list of references provided below.

It is accordingly the primary objective of the present invention that it provide a systematic method to transform a behavioral specification into a data flow structure optimized for a particular architectural optimization objective.

It is another objective of the present invention that it provide a method and system for transforming a behavioral specification into a data flow structure by performing a series of formal transformations based on a canonical representation and integrating them with an architectural synthesis flow.

A further objective of the present invention is that it provide a method and system for transforming a behavioral specification into a data flow structure using techniques of factorization, common sub-expression extraction, and decomposition that employ transformations based on Taylor Expansion Diagrams.

Another objective of the present invention is that it provide a method and system for performing behavioral transformations wherein Taylor Expansion Diagrams are used as a canonical representation to explore a larger solution space for architectural optimization.

Yet another objective of the present invention is that it provide a behavioral synthesis method that reduces the synthesis time and results in higher quality of synthesized designs.

The present invention also has as an objective providing a general, method for performing factorization of an arbitrary mathematical expression based on Taylor Expansion Diagram and manipulating on it. Factorization can be performed according to a cost function (for example: reducing the number of multiplications, reducing the number of steps to compute the expression, etc.). Common sub-expression elimination (CSE) does not need a cost function, since eliminating redundant computation can only have beneficial effect on computation simplification. These factorization methods are performed by modifying the input bases of the computed expression as shown for the CSE process.

Another objective of the present invention is that it provide a method for code optimization prior to compilation. All compilers that deal with expressions that can be handed by a TED are a target of this invention. The present invention can reduce the compilation time and can generate a better code with lower compiling effort.

REFERENCES

The following background information, together with other aspects of the prior art, including those teachings useful in light of the present invention, are disclosed more fully and better understood in light of the following references, each of which is incorporated herein in its entirety.

[1] G. DeMicheli, Synthesis and Optimization of Digital Circuits, McGraw-Hill, 94.
[2] Y-L. Lin, "Recent Developments in High-Level Synthesis," ACM Transactions on Design of Electronic Systems, pp. 2-21, 1997.
[3] W. Rosenstiel and H. Kramer, Scheduling and Assignment in High Level Synthesis, High-Level VLSI Synthesis, Kluwer Academic Publishers, 1991.
[4] R. Camposano, R. Bergamaschi, C. Haynes, M. Payer, and S. Wu, The IBM High-Level Synthesis System, Kluwer Academic Publishers, 1991.
[5] P. Michel, U. Lauther, and P. Duzy, The Synthesis Approach to Digital System Design, Kluwer Academic Publishers, 1992.
[6] D. Gajski, N. Dutt, A. Wu, and S. Lin, *High Level Synthesis—Introduction to Chip and System Design*, 1992.
[7] R. Walker and D. Thomas, "Behavioral Transformations for Algorithmic Level 1C Design," IEEE Trans. on Computer-Aided Design, pp. 1115-1128, October 1989.
[8] L. Guerra, M. Potkonjak, and J. Rabaey, "High level Synthesis for Reconfigurable Datapath Structures," in ICCAD'93, 1993.
[9] V. Chaiyakul, D. Gajski, and R. Ramachandran, "High-level Transformations for Minimizing Syntactic Variances," Proc. Design Automation Conference, DAC'93, pp. 413-418, 1993.
[10] M. Potkonjak and J. Rabaey, "Optimizing Resource Utilization Using Transformations," in *IEEE Trans. on Computer-Aided Design*, 1994.
[11] A. Chandrakasan, M. Potkonjak, R. Mehra, Rabaey J., and Brodersen R., "Optimizing Power Using Transformations," in IEEE Trans. on Computer-Aided Design, 1995, pp. 12-30.
[12] M. Potkonjak, S. Dey, and R. Roy, "Synthesis for Testability Using Transformations," in ASP-DAC'95, 1995, pp. 485-490.
[13] M. Srivastava and M. Potkonjak, "Optimum and Heuristic Transformation Techniques for Simultaneous Optimization of Latency and Throughput," in IEEE Transactions on VLSI Systems, 1995.
[14] J. D. Ullman, Compilers: Principles, Techniques and Tools, Addison-Wesley, 1986.
[15] A. Peymandoust and G. DeMicheli, "Application of Symbolic Computer Algebra in High-Level Data-Flow Synthesis," IEEE Trans. on Computer-Aided Design, vol. 22, no. 9, pp. 1154-1165, September 2003.
[16] J. Smith and G. DeMicheli, "Polynomial Methods for Component Matching and Verification," in Intl. Conference on Computer-Aided Design, ICCAD'98, 1998.
[17] M. Ciesielski, P. Kalla, and Z. Zeng, "Taylor Expansion Diagrams: A Compact Canonical Representation for Arithmetic Expressions," Tech. Rep. TR-CSE-01-02, Dept. of ECE, Univ. of Massachusetts, April 2001.
[18] M. Ciesielski, P. Kalla, Z. Zeng, and B. Rouzeyre, "Taylor Expansion Diagrams: A Compact Canonical Representation with Applications to Symbolic Verification," in Design Automation and Test in Europe, DATE-02, 2002, pp. 285-289.
[19] P. Kalla, M. Ciesielski, E. Boutillon, and E. Martin, "High-level Design Verification using Taylor Expansion Diagrams: First Results," in IEEE Intl. High Level Design Validation and Test Workshop, HLDVT-02, 2002, pp. 13-17.
[20] LESTER Universite de Bretagne Sud, GAUT, Architectural Synthesis Tool, http://lester.univ-ubs.fr:8080.

[21] R. Bryant, "Graph-Based Algorithms for Boolean Function Manipulation," IEEE Transactions on Computers, vol. 35, no. 8, pp. 677-691, August 1986.

[22] R. E. Bryant and Y-A. Chen, "Verification of Arithmetic Functions with Binary Moment Diagrams," in Proc. Design Automation Conference, DAC'95, 1995.

[23] C. Yang and M. Ciesielski, "BDS: A BDD-based Logic Optimization System," IEEE Trans. on Computer-Aided Design, vol. 21, no. 7, pp. 866-876, July 2002.

[24] D. Gomez-Prado, S. Askar, Q. Ren, M. Ciesielski, and E. Boutillon, "Variable Ordering for Taylor Expansion Diagrams", IEEE International High-Level Design Validation and Test Workshop, HLDVT-04, 2004, pp. 55-59.

[25] M. Püschel, J. M. F. Moura, J. Johnson, D. Padua, M. Veloso, B. W. Singer, J. Xiong, F. Franchetti, A. Gačić, Y. Voronenko, K. Chen, R. W. Johnson, and N. Rizzolo, "SPIRAL: Code Generation for DSP Transforms," Proceedings of the IEEE, special issue on "Program Generation, Optimization, and Adaptation", vol. 93, No. 2, 2005.

[26] S. Gupta, M. Reshadi, N. Savoiu, N. Dutt, R. Gupta, and A. Nicolau, "Dynamic Common Sub-expression Elimination during Scheduling in High-level Synthesis," ISSS'02: Proceedings of the 15th International Symposium on System Synthesis, New York, NY, USA, 2002, pp. 261-266, ACM Press.

[27] S. Egner and M. Püschel, "Symmetry-based Matrix Factorization," Journal of Symbolic Computing, vol. 37, No. 2, pp. 157-186, 2004.

SUMMARY OF THE INVENTION

The disadvantages and limitations of the background art discussed above are overcome by the present invention. With this invention, there is provided a systematic method and system for behavioral transformations for hardware synthesis and code optimization in software compilation based on canonical representation of the computation. By way of non-limiting example, Taylor Expansion Diagrams are used as such canonical representation to explore a larger solution space for architectural or algorithmic optimization. The method and system of the present invention provide a systematic transformation of a behavioral specification into a data flow structure optimized for a particular optimization objective. The TED is used to guide behavioral transformations leading to efficient hardware implementations. In this way, the present invention provides the behavioral synthesis with a means to perform a series of formal transformations, based on a canonical representation of the computation, and integrate them with the architectural synthesis flow to allow for design exploration of a larger solution space. In the field of compilation tools, the TED-based decomposition can be used to guide algorithmic transformations to produce an optimized functional view of the original code; this, in turn, can be used to generate an input code for compiler and to allow the compiler to produce a better solution.

In contrast to the traditional high-level synthesis methods that offer only limited structural manipulation of the data flow graph (DFG), the present invention provides a systematic way to perform functional transformations of the initial specification to derive the best DFG for the particular design objective. These transformations use Taylor Expansion Diagram (TED) as a canonical representation of the computation. Due to its canonicity, the TED encompasses an entire class of DFGs, rather than a single data flow graph, that represent the computation. The behavioral transformation techniques of the present invention do not require any specification of "side relations", as is the case of SymSyn system disclosed in A. Peymandoust and G. DeMicheli, "Application of Symbolic Computer Algebra in High-Level Data-Flow Synthesis," IEEE Trans. on Computer-Aided Design, vol. 22, no. 9, pp. 1154-1165, September 2003. The present invention is based on the construction, ordering, decomposition and simplification of the canonical TED diagrams.

The novel behavioral transformation method is based on structural decomposition of the diagram, allowing the designer to explore an entire family of solutions, rather than only the single solution that results from using the tools currently available on the market. The canonical property of the representation and global optimization significantly increase the quality of synthesized systems or compiled codes and allow optimum solutions to be obtained faster.

The global view of the problem, inherent in the data representation and the decomposition method, drastically reduces the synthesis or compilation time and results in higher quality of synthesized designs or in better runtime for the compiled code.

More specifically, the present invention provides a method of transforming a behavioral-level specification into a data flow structure. The method includes the steps of: representing the behavioral-level specification in a canonical data structure; performing a series of formal transformations on the canonical data structure by means of the decomposition of the canonical structure; and integrating the transformations with an architectural synthesis flow.

Further in accordance with the invention, there is provided a method of transforming a behavioral specification of a behavioral-level hardware description languages (HDL) design into a data flow structure. The method includes the steps of: parsing the original behavioral-level HDL design; extracting a data flow graph to produce an intermediate format; using the intermediate format obtained to create a TED data structure for computation; performing common sub-expression extraction and/or factorization of the global Taylor Expansion Diagram to produce a hierarchical Taylor Expansion Diagram; performing decomposition of the global Taylor Expansion Diagram; and deriving optimized data flow graphs from the decomposition.

In accordance with the invention, there is provided a method for behavioral transformation of a behavioral-level design and/or an analytical representation of the design for hardware synthesis and code optimization. The method includes the steps of: extracting an arithmetic expression of the computation from the behavioral-level design or directly from the analytical representation; representing the arithmetic expression in a canonical data structure; performing common sub-expression extraction and/or factorization of the canonical data structure to produce a hierarchical canonical data structure; performing decomposition of the hierarchical canonical data structure; deriving optimized data flow graphs from the decomposition; and obtaining a structural hardware description language design from the data flow graphs using standard architectural synthesis.

The invention further provides a method for behavioral transformation of a behavioral-level design and/or an analytical representation of the design for hardware synthesis and code optimization. The method includes the steps of: extracting an arithmetic expression of the computation from the behavioral-level design or directly from the analytical representation; representing the arithmetic expression in a canonical data structure; performing common sub-expression extraction and/or factorization of the canonical data structure to produce a hierarchical canonical data structure; performing decomposition of the hierarchical canonical data structure; deriving optimized data flow graphs from the decomposition;

and obtaining a structural hardware description language design from the data flow graphs using standard architectural synthesis.

The invention further provides a method of factoring and decomposing an arithmetic expression. The method includes the steps of: representing the arithmetic expression in a canonical data structure; performing common sub-expression extraction and/or factorization of the canonical data structure to produce a hierarchical canonical data structure; performing decomposition of the hierarchical canonical data structure by decomposing subgraphs of the hierarchical canonical data structure; and deriving optimized data flow graphs from the decomposition. Decomposing the canonical data structure into a data flow graph includes identifying useful cuts and admissible cut sequences, selecting the best cut sequence for the given objective, performing a decomposition of the canonical data structure for the selected cut sequence, forming a decomposed portion. In accordance with the invention, Taylor Expansion Diagrams (TEDs) can be used as a canonical representation to explore a larger solution space for architectural or algorithm optimization.

DESCRIPTION OF THE DRAWINGS

These and other advantages of the present invention are best understood with reference to the drawings, in which:

FIG. 3a showing the initial TED representation; FIG. 3b showing the TED after extracting $S1=(x0-x3)$ and $S2=(x0+x3)$; and FIG. 3c showing final TED after extracting $S3=(x1-x2)$ and $S4=(x1+x2)$.

FIG. 4a showing the original TED for expression $P=(A+B+C+D+E)(G+H+F(I+J))$; FIG. 4b showing the hierarchical TED obtained by common sub-expression extraction; FIG. 4c showing the TED of subgraph SG1; and FIG. 4d showing the TED of subgraph SG2.

FIG. 5b showing a partially scheduled DFG of the global TED.

FIG. 6b showing the DFG obtained from the TED by applying the cut sequence {A3,A1,M1,A2} or {A3,M1,A1,A2}; FIG. 6c) showing the DFG obtained from the TED by applying the cut sequence {A1,A3,M1,A2};

FIG. 12a is a process flow diagram for a method of providing TED construction for the process of FIG. 10a.

FIG. 13b showing the data flow graph for the output obtained by the architectural synthesis tool for the elliptic filter; and FIG. 13c showing the optimized DFG obtained by TED decomposition.

DETAILED DESCRIPTION OF THE PREFERRED EMBODIMENT

Figure 1:
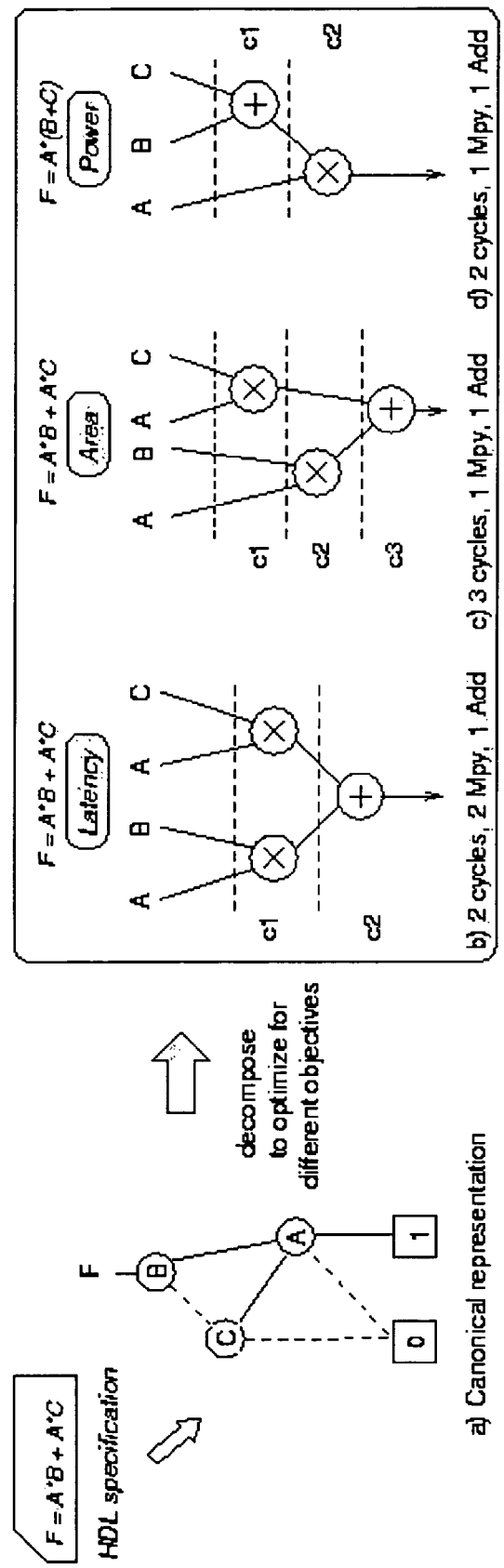
FIGS. 1a-1d illustrate behavioral synthesis based on canonical TED representation of a data flow graph, optimized for different objectives, with FIG. 1a showing a canonical TED representation of an expression, FIGS. 1b and 1c showing two possible architectural solutions (DFGs) that can be obtained from a fixed data flow graph of the canonical TED representation of the expression, and FIG. 1d showing a solution obtained by factorizing the original expression.

The present invention provides a systematic method and system for behavioral transformations for hardware synthesis and code optimization in software compilation based on canonical representation of the computation. By way of non-limiting example, Taylor Expansion Diagrams are used as such canonical representation to explore a larger solution space for architectural or algorithmic optimization. The TEDs are used to guide behavioral transformations leading to efficient hardware or software implementations. The system can be integrated with any suitable architectural synthesis system. It can also be built into a compiler tool for general purpose processor or into a specific target compiler. For hardware synthesis, an arithmetic expression of the computation is extracted from the behavioral-level HDL design or directly from its matrix representation, and represented in canonical data structure, called Taylor Expansion Diagram. In architectural synthesis, factorization, common sub-expression extraction and decomposition of the resulting Taylor Expansion Diagram is performed, producing an optimized data flow graph, or structural representation, from which the structural HDL design is obtained using standard architectural synthesis. For software compilation and code optimization, common sub-expression extraction and factorization serve as pre-compilation optimization tasks performed according to the target architecture to generate a new code for the compiler. Thus, the present invention provides a method for behavioral transformation of a behavioral-level design and/or an analytical representation of the design for hardware synthesis and code optimization.

The present invention is described with reference to behavioral transformations for hardware synthesis. However, the present invention can be used in other applications, such as for code optimization prior to compilation. All compilers that deal with expressions that can be handed by a Taylor Expansion Diagram are a target of this invention. The present invention can reduce the compilation time and can generate a better code with lower compiling effort.

The present invention provides the behavioral synthesis with a means to perform a series of formal transformations, based on a canonical representation, and to integrate these transformations with an architectural synthesis flow to allow for exploration of a larger solution space. In particular, the present invention offers a systematic method to transform a behavioral specification into a data flow structure, optimized for a particular architectural optimization objective.

In contrast to the traditional high-level synthesis methods that offer only limited manipulation of the data flow graph (DFG), the invention provides a systematic way to perform behavioral transformations of the DFG. These transformations use Taylor Expansion Diagram (TED) as a canonical representation of the arithmetic computation. Due to its canonicity, the TED encompasses an entire class of functionally equivalent DFGs, rather than a single data flow graph. The behavioral transformation techniques in accordance with the invention do not require any specification of "side relations", as is the case of SymSyn system described in the paper entitled "Application of Symbolic Computer Algebra in High-Level Data-Flow Synthesis," by A. Peymandoust and G. DeMicheli, in IEEE Trans. on Computer-*Aided Design*, vol. 22, no. 9, pp. 1154-1165, September 2003. The present invention is based on the construction, ordering, factorization, common sub-expression extraction, decomposition and simplification of the canonical TED diagrams.

Consider a simple computation, F=A·B+A·C. FIGS. 1a-1d illustrate behavioral synthesis based on canonical TED representation of a DFG derived for this expression, optimized for different objectives. This expression can be represented in a canonical form as a TED, shown in FIG. 1a. Existing commercial tools can only derive a single, fixed data flow graph (DFG) for this computation with no capability to transform behavioral expressions into another, better DFG (from a given objective point of view) prior to applying architectural synthesis. Two possible architectural solutions can be obtained from a fixed data flow graph corresponding to this expression; they are shown in FIGS. 1b and 1c. In order to explore other solutions, the user must rewrite the original HDL specification from which another fixed DFG can be derived and subjected to another run of architectural optimization (including scheduling, allocation, resource binding, etc.). In particular, the existing tools cannot reach the solution shown in FIG. 1d, which uses a minimum number of operators and is scheduled with the minimum number of clock cycles. This solution, however, is reachable by transforming the original specification F=A·B+A·C into A·(B+C) by means of TED ordering, factorization and/or decomposition. The modified expression can then be scheduled in two clock cycles and uses one adder and one multiplier, as shown in FIG. 1d. Any of the three solutions can be obtained using the proposed canonical representation by properly guiding the decomposition process.

TED as Canonical Representation

Figure 9:
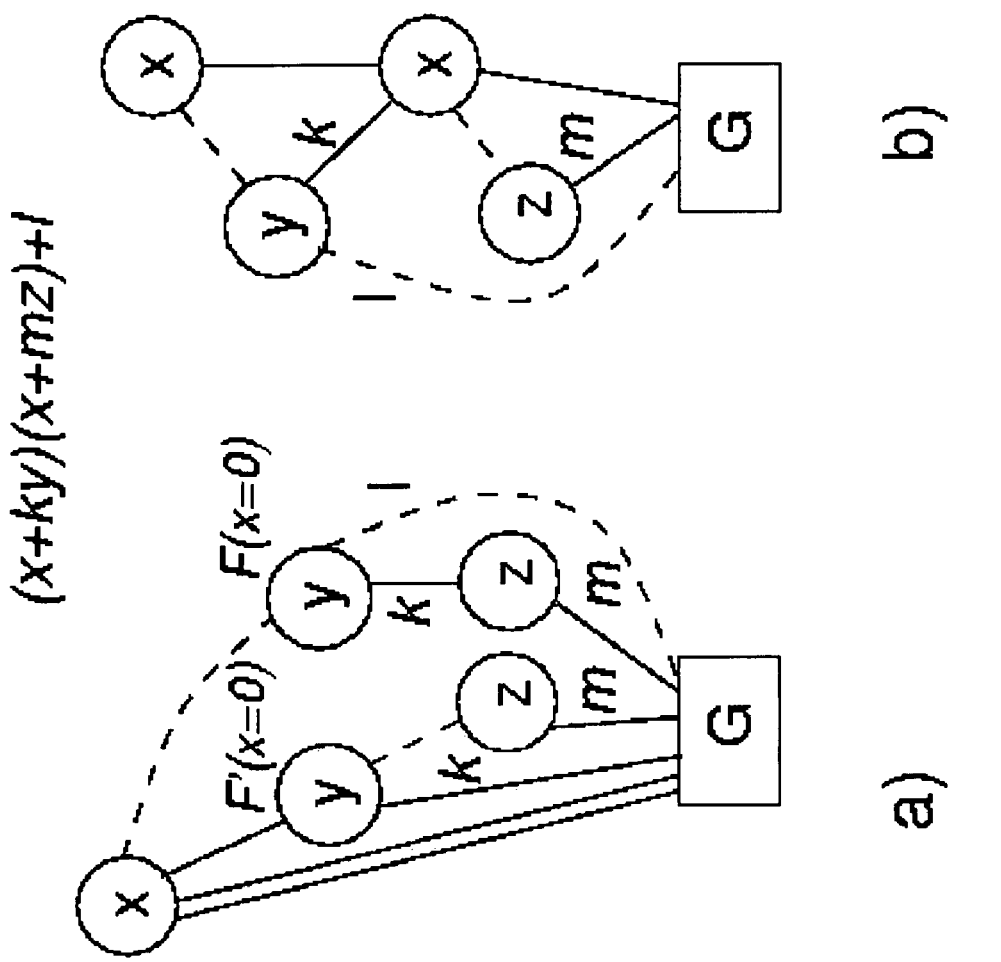
FIGS. 9a and 9b illustrate TED decomposition into atomic structures.
Figure 10:
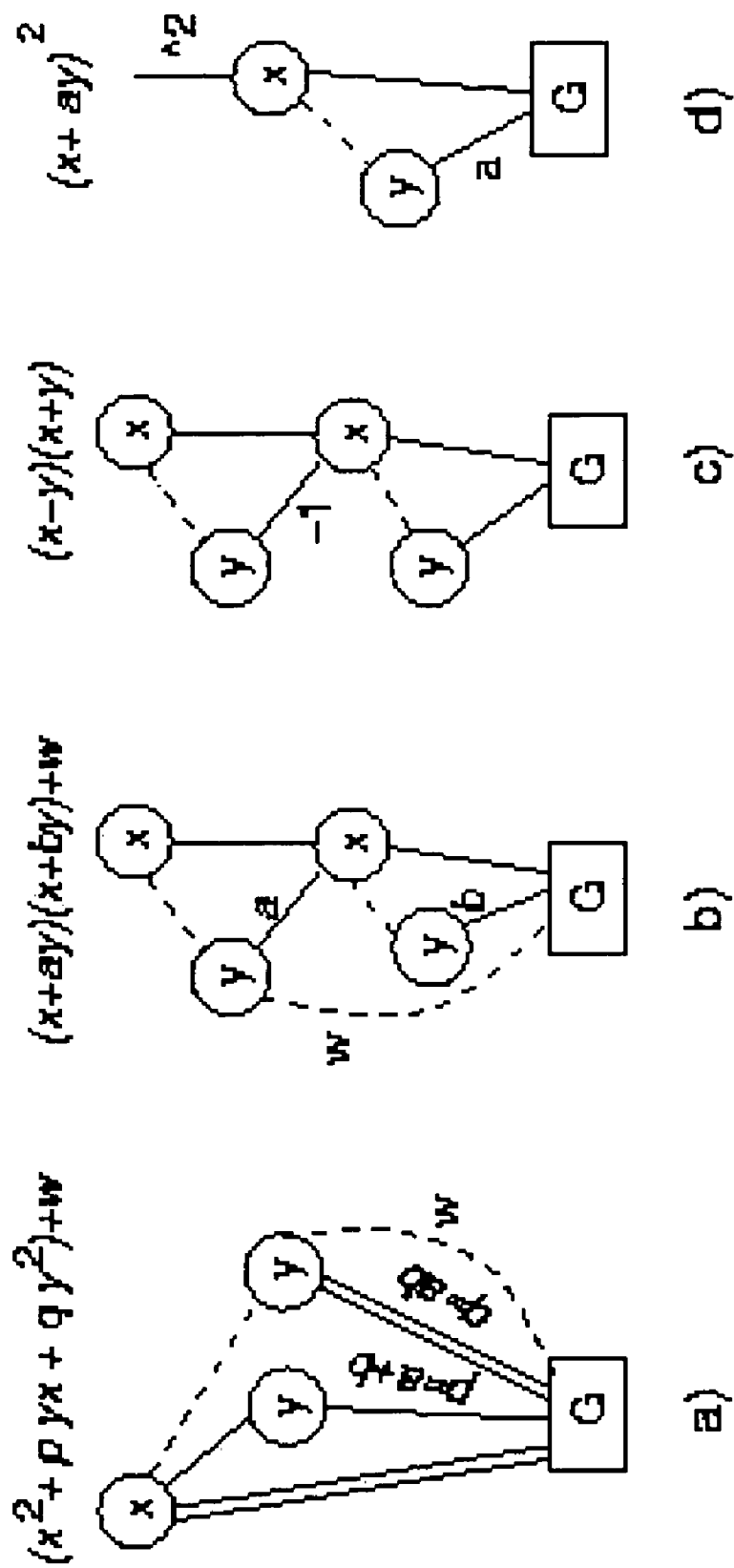
FIGS. 10a-10d show decomposition of a polynomial using pattern matching.

Taylor Expansion Diagrams (TEDs) offer a convenient way to represent computations by means of polynomials. In this context, TED offers an efficient way to simplify, factorize and/or decompose arithmetic expressions derived from the HDL design specifications. Each node of the TED represents a variable, and each edge represents the multiplication or addition of two variables. In case of linear multivariate polynomials, such as those shown in FIG. 1a, and FIGS. 3-7, there are only multiplicative edges (shown as solid lines) and additive edges (shown as dotted lines). In case of polynomials of higher degrees, additional edges representing powers of the respective variables are present in the graph. See FIG. 9 and FIG. 10 as examples of such representations. The details of TED representation are given in the publication [18]. Several objective functions can be used to guide this decomposition, including design area, delay, latency, power, and arithmetic precision.

Behavioral transformations of an arithmetic expression are accomplished by performing a series of decomposition operations on the TED that represents the expression. The following basic operations are defined on a TED: common sub-expression elimination, factorization, disjunctive decomposition and conjunctive decomposition; all of them are designed to transform the functional TED representation into a DFG structure. FIGS. 1a through 1d illustrate the basic idea of TED decomposition, which allows converting the canonical TED into a family of equivalent DFGs.

During the decomposition, the canonical structure of the TED is gradually replaced by the implementation structure. The resulting structure is non-unique and depends on the particular optimization objective by which the entire decomposition is guided: design area, latency, power, computational precision, and others. That is, the decomposition of TED is a process of transforming functional representation into structural implementation, guided by the required optimization objective.

The TED is a graph representation that facilitates factorization and extraction of common sub-expressions. This is illustrated in FIG. 1a, where, an internal node representing variable A has two parent edges pointing to it from nodes representing variables B and C. This means that sub-expression rooted in node "A" appears twice in the original expression, "AB+AC", once in AB and once in AC. Subsequently, variable A can be factored out from the two expressions, AB and AC, leading to a factored form "A(B+C)". The TED encodes this factorization in a very compact way, provided that it uses a correct variable order. Typically, variable ordering that minimizes the number of nodes results in the overall best factoring and decomposition; however, two different orderings with the same number of nodes may have different factorizations associated with it.

Variable ordering employed in the TED can be static or dynamic. The ordering is static, if it is based on the global analysis of the arithmetic expression prior to the construction of the TED. The ordering is dynamic if it is obtained by local reordering of nodes in the already constructed TED. The applicants have developed static and dynamic ordering of variables, as described in the paper "Variable Ordering for Taylor Expansion Diagrams" by D. Gomez-Prado, S. Askar, Q. Ren, M. Ciesielski and E. Boutillon, *IEEE Inlt. High*-Level Design Validation and Test Workshop, HLDVT-04, 2004, pp. 55-59.

Common Sub-Expression Elimination

The present invention performs factorization and common sub-expression extraction using TED as the underlying data structure. Useful sub-expression extraction and/or factorization are manifested in the TED graph by the presence of nodes with multiple parent (reference) edges. The fact that a given node N is referred by multiple parent edges means that the sub-expression rooted at node N is shared by a set of expressions represented by paths from the TED root (or a set of roots in case of a multi-function TED) to the terminal node 1, passing through the node N. In the corresponding data flow graph, the sub-expression rooted at node N needs to be computed only once, thus reducing the complexity of the design by means of factorization. In order to employ this factorization during the other steps of optimization, the sub-expression rooted at node N is replaced by a single new variable, S. An additional TED is generated for the sub-expression SN, rooted at node N, to allow the subsequent generation of the dataflow graph for that sub-expression. Once a given factorization has been done, the process of factorization can be performed in the modified TED with the new variable S, as well as in the newly generated TED for the sub-expression SN.

In a canonical TED, when an expression contains multiplication by some constant, that constant appears as a weight assigned to a multiplicative edge of the TED. In order to enable common sub-expression extraction that can handle constant coefficients, those coefficients are replaced by symbolic variables. The resulting transformed TED is then ordered so that the nodes corresponding to those symbolic variables appear on the top of the TED graph. For example, the initial TED that correspond to an expression 12*X is composed of a single node X connected to the terminal node 1 through a multiplicative edge of weight 12. The transformed TED will contain two nodes, a symbolic variable A (associated with the constant 12), connected through a multiplicative edge to the node X, and node X, connected by a multiplicative edge to the terminal node 1. The example presented in FIG. 3a will clarify this method later.

Figure 2:
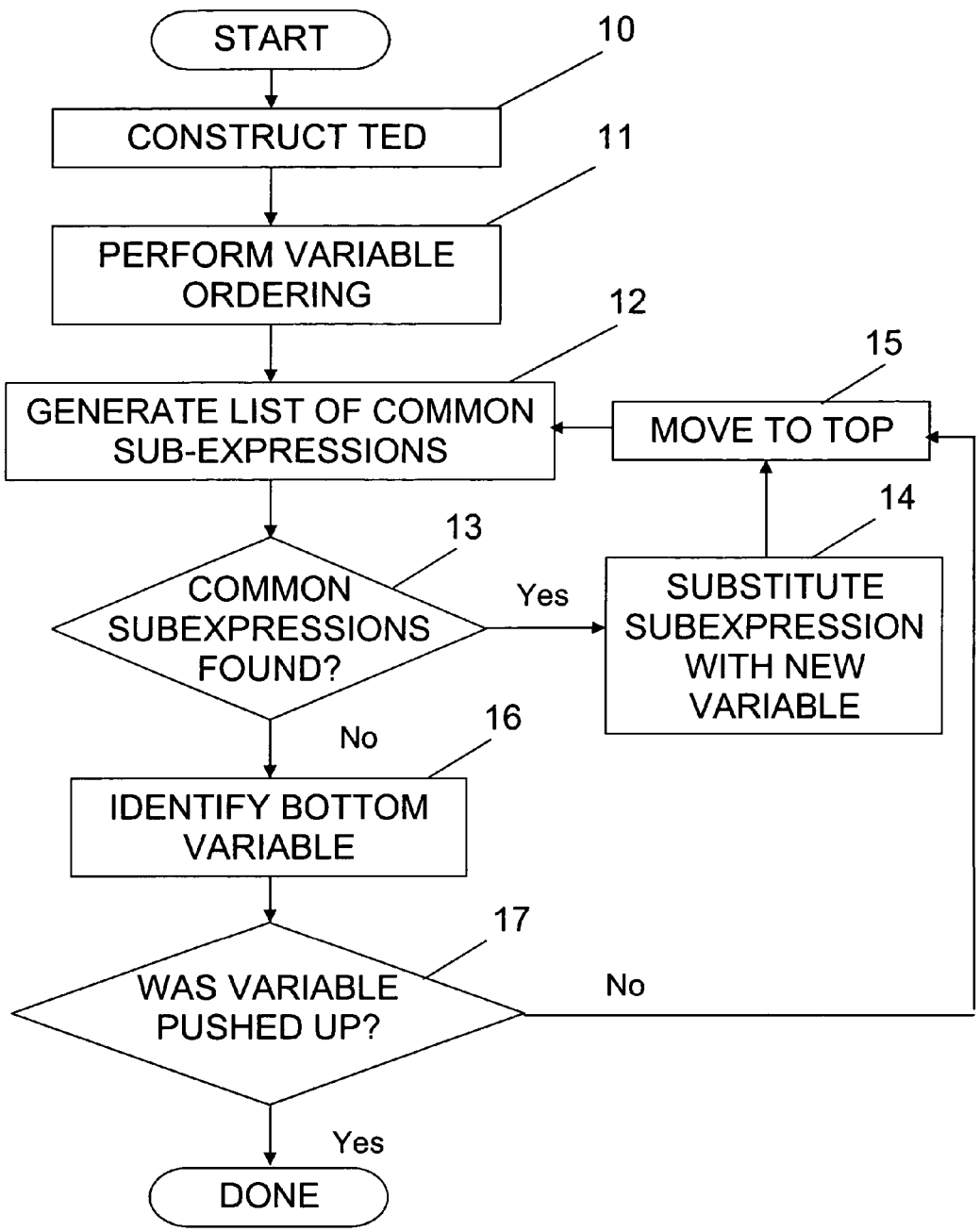
FIG. 2 illustrates the algorithm for common sub-expression elimination.

Referring to FIG. 2, the TED-based factorization and common sub-expression extraction algorithm is composed of the following steps. In Block 10, the TED is constructed with constants placed as top variables. Ordering of the remaining variables, which minimizes the TED size, is performed in Block 11. A list of common sub-expressions, determined by multiple parent edges, is generated in Block 12. Decision Block 13 determines if any common sub-expressions have been found. If this is the case, Block 14 extracts sub-expression from the list and substitutes it with a new variable. In Block 15 the new variable is placed on top of TED, below the constant nodes. The flow returns through Block 12 to Block 13 and continues until there are no more sub-expressions left for extraction. (Alternatively, if the candidate expressions are independent of each other, the loop 12-13-14-15 can be replaced by performing substitution of all the expressions at once). If Block 13 determines that there are no more sub-expressions left, the process proceeds to Block 16, where the most bottom variable is identified. The bottom variables that do not contribute to factorization are pushed to the top to expose new variables for factorization. The decision Block 17 checks whether the bottom variable has been already pushed up to the top. If this is not the case, the flow returns to Block 15, where the variable is pushed to the top of TED. Otherwise, it indicates that all variables have been already examined, and the variable made a full circle in the TED. At this point the procedure terminates (Done).

Thus, performing sub-expression extraction and/or factorization includes the steps of identifying common sub-expressions contained in the Taylor Expansion Diagram; extracting the common sub-expressions by substituting a new variable for each sub-expression that is identified, producing a hierarchical Taylor Expansion Diagram. The order of the variables of the hierarchical Taylor Expansion Diagram thus obtained is changed to exhibit new potential factorization. The new variables thus created are moved towards the top of the Taylor Expansion Diagram. Common sub-expression extraction and/or factorization are used to reduce the size of the TED and to enable the subsequent decomposition of the TED.

The above algorithm is more general than that used by specialized tools, such as SPIRAL [reference 25]; it can be applied to arbitrary DSP designs and transforms, where exact computational structure is not known a priori.

Example of a Discrete Cosine Transform

The application of the above TED-based algorithm for factorization and common sub-expression elimination is illustrated with an example of a Discrete Cosine Transform (DCT), commonly used in Digital Signal Processing (DSP) applications. The computation performed by a DCT can be represented in matrix notation as $F=M \cdot x$, where F and x are the output and input vectors, and M is a two-dimensional matrix with integer coefficients. It is important that coefficients with the same (or rounded to the same) numeric value are represented by a common symbolic variable, e.g., cos $(\pi/4)$ and cos $(7\pi/4)$ should be represented by the same symbolic variable, say D. Furthermore, the dependence between the coefficients should be recognized up to and including their sign, e.g., if cos $(\pi/4)=D$, then cos $(3\pi/4)=-D$.

Figure 3A:
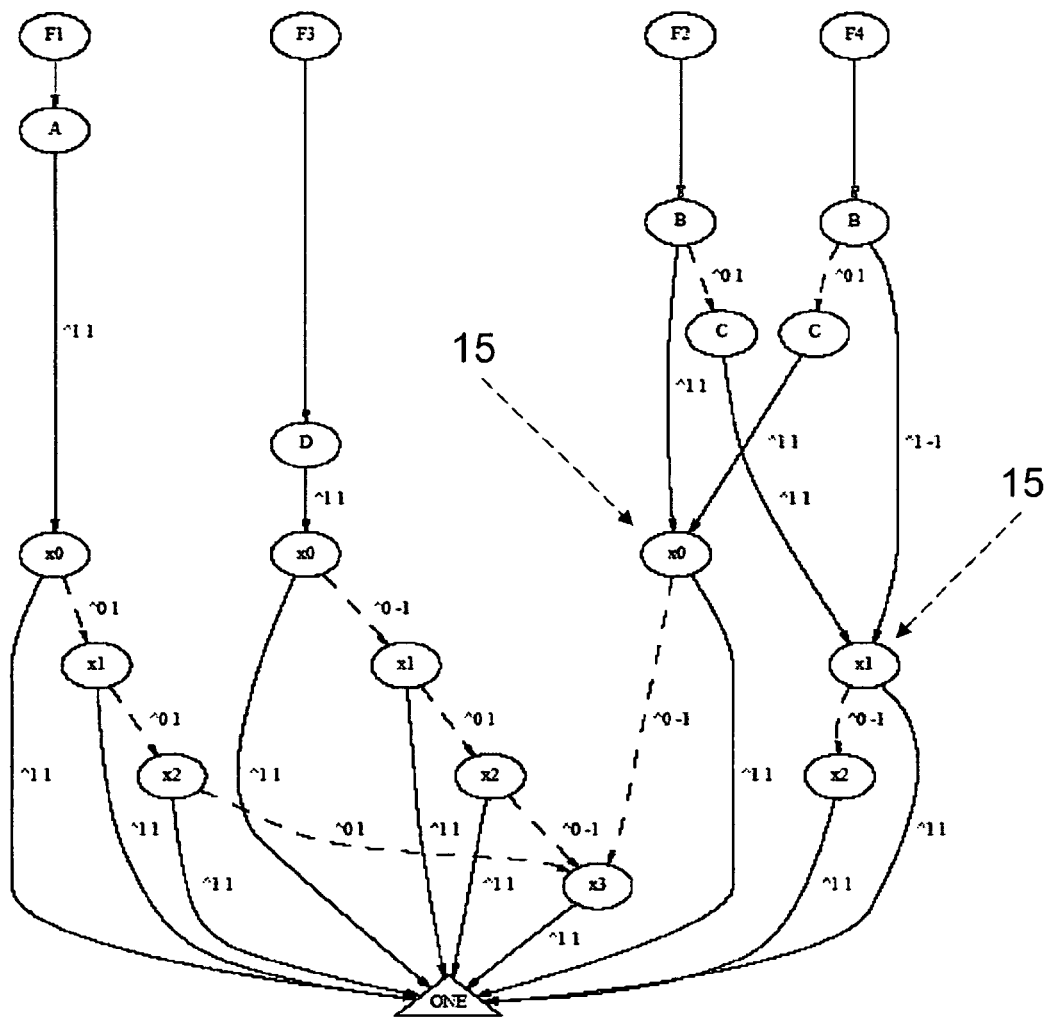
FIGS. 3a-3c illustrate common sub-expression extraction for a DCT transform or size 4.
Figure 3B:
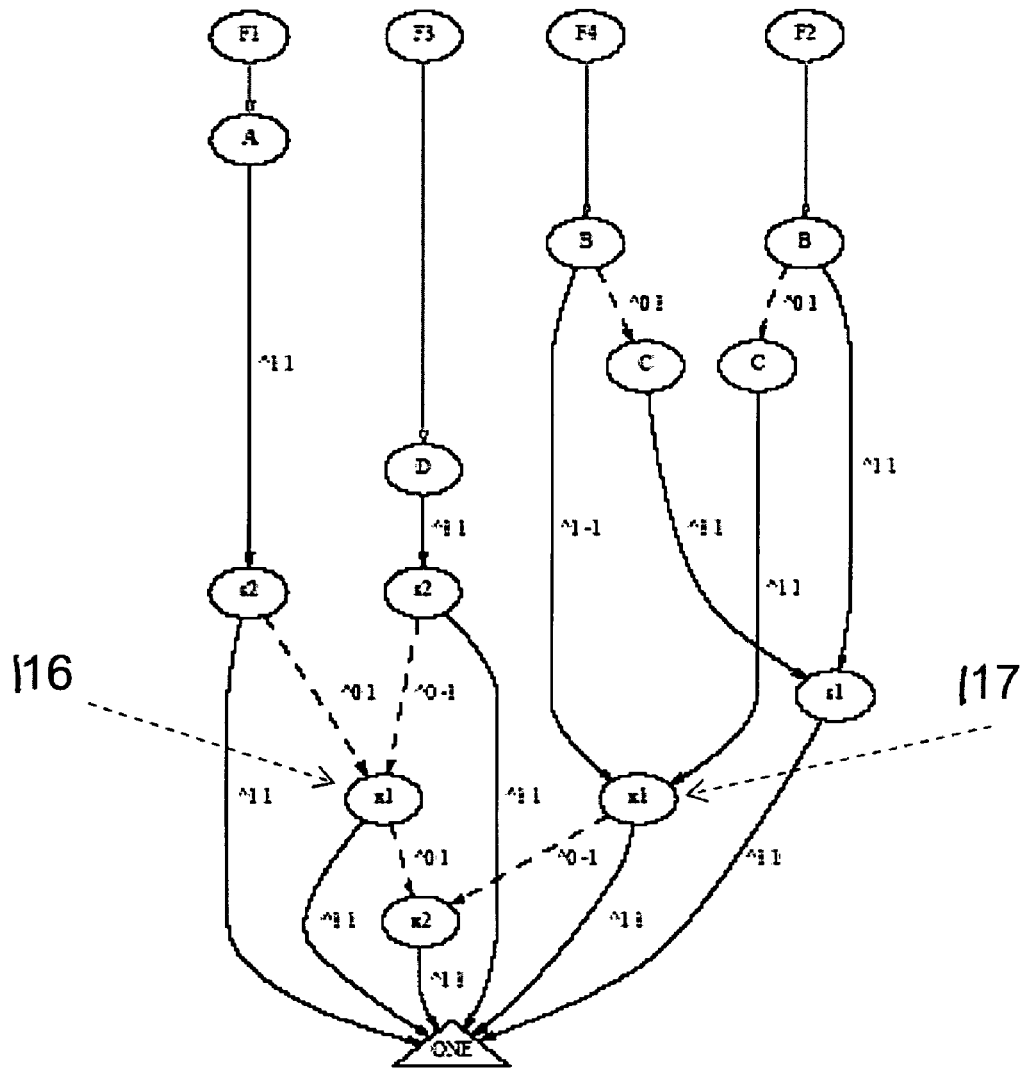
Figure 3C:
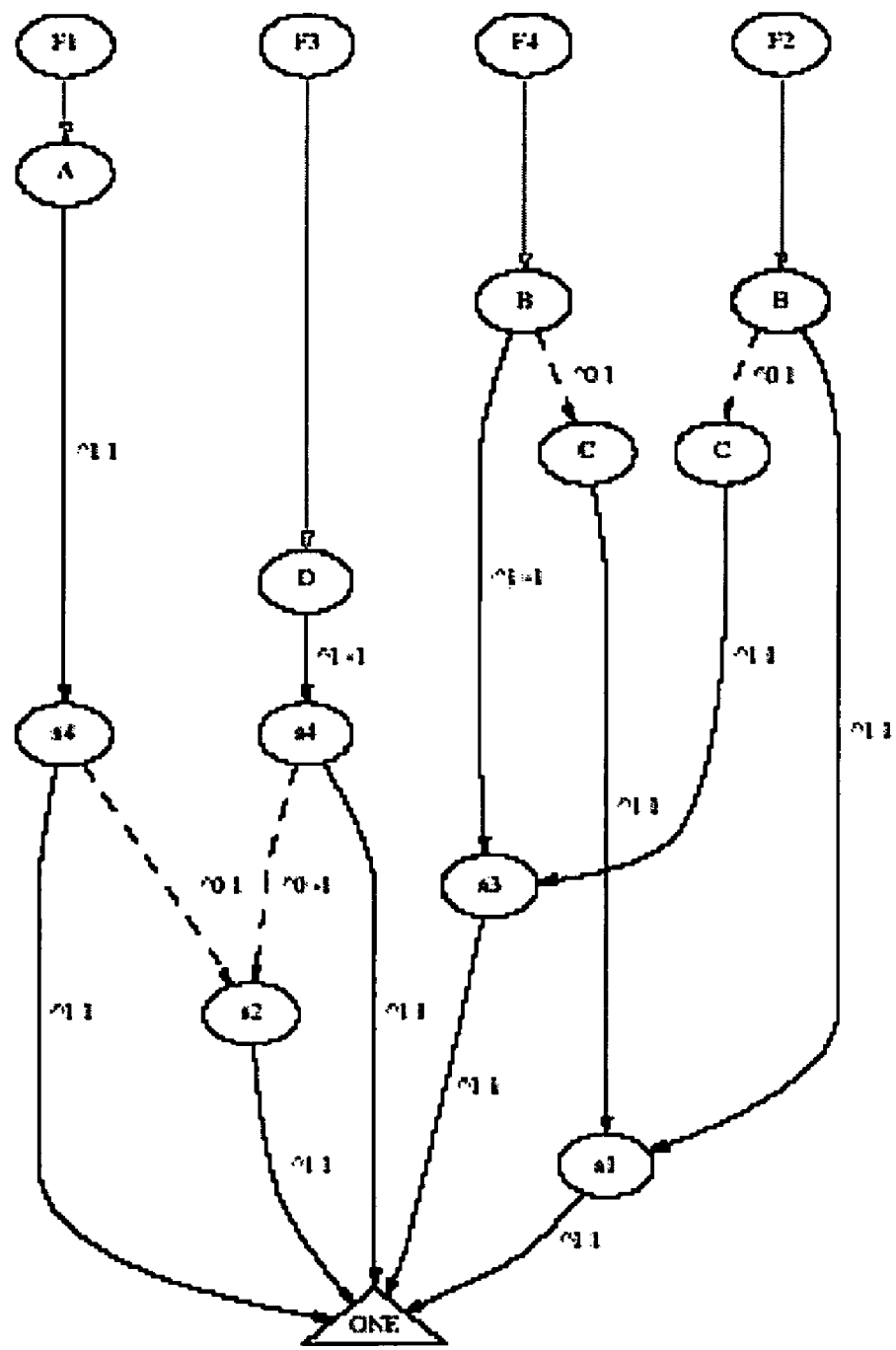
Figure 4:
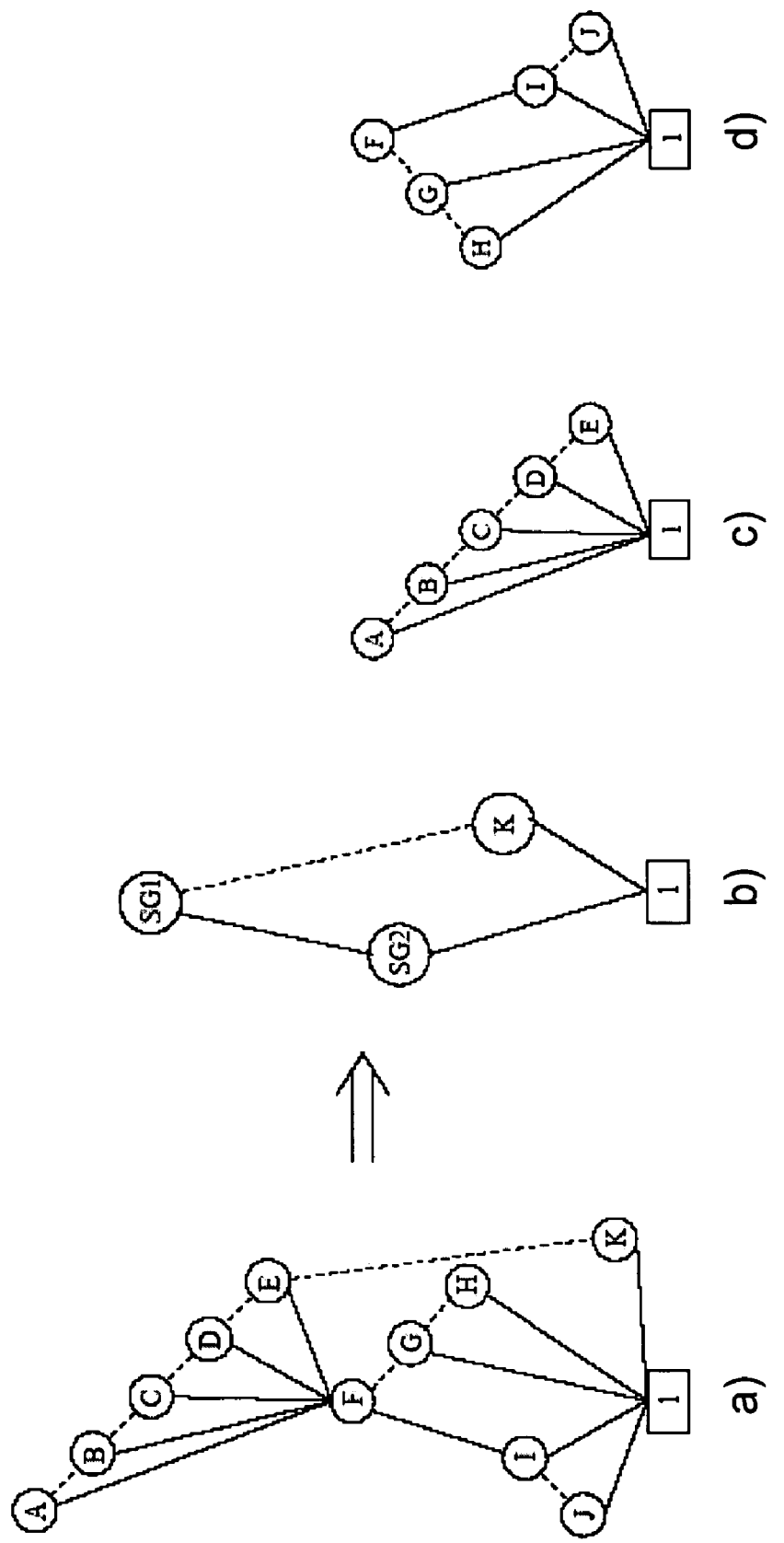
FIGS. 4a-4d illustrate generation of hierarchical TED.
Figure 5:
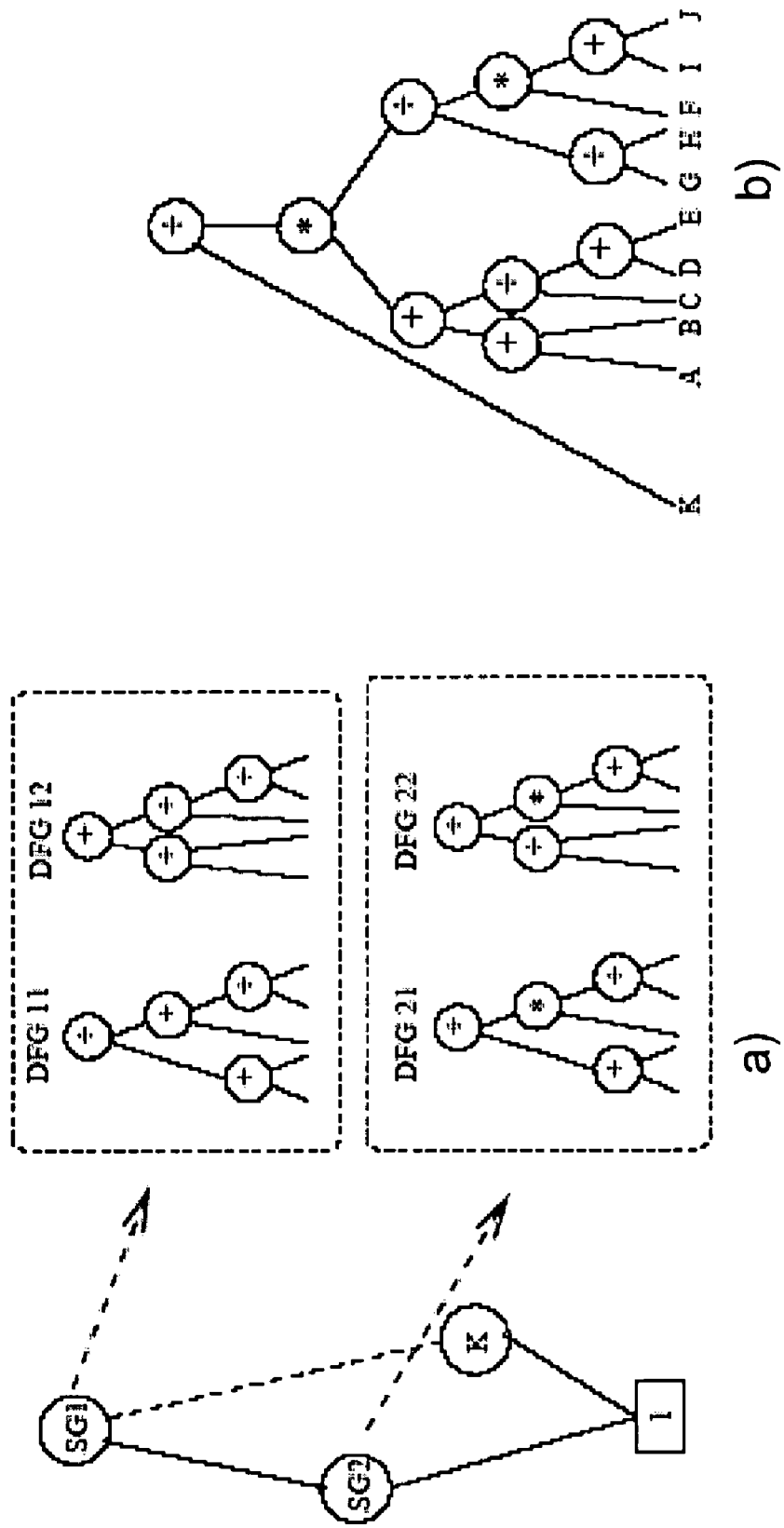
FIGS. 5a-5b illustrate the hierarchical approach to a TED-to-DFG transformation FIG. 5a) showing the generation of DFGs for each subgraph.
Figure 6:
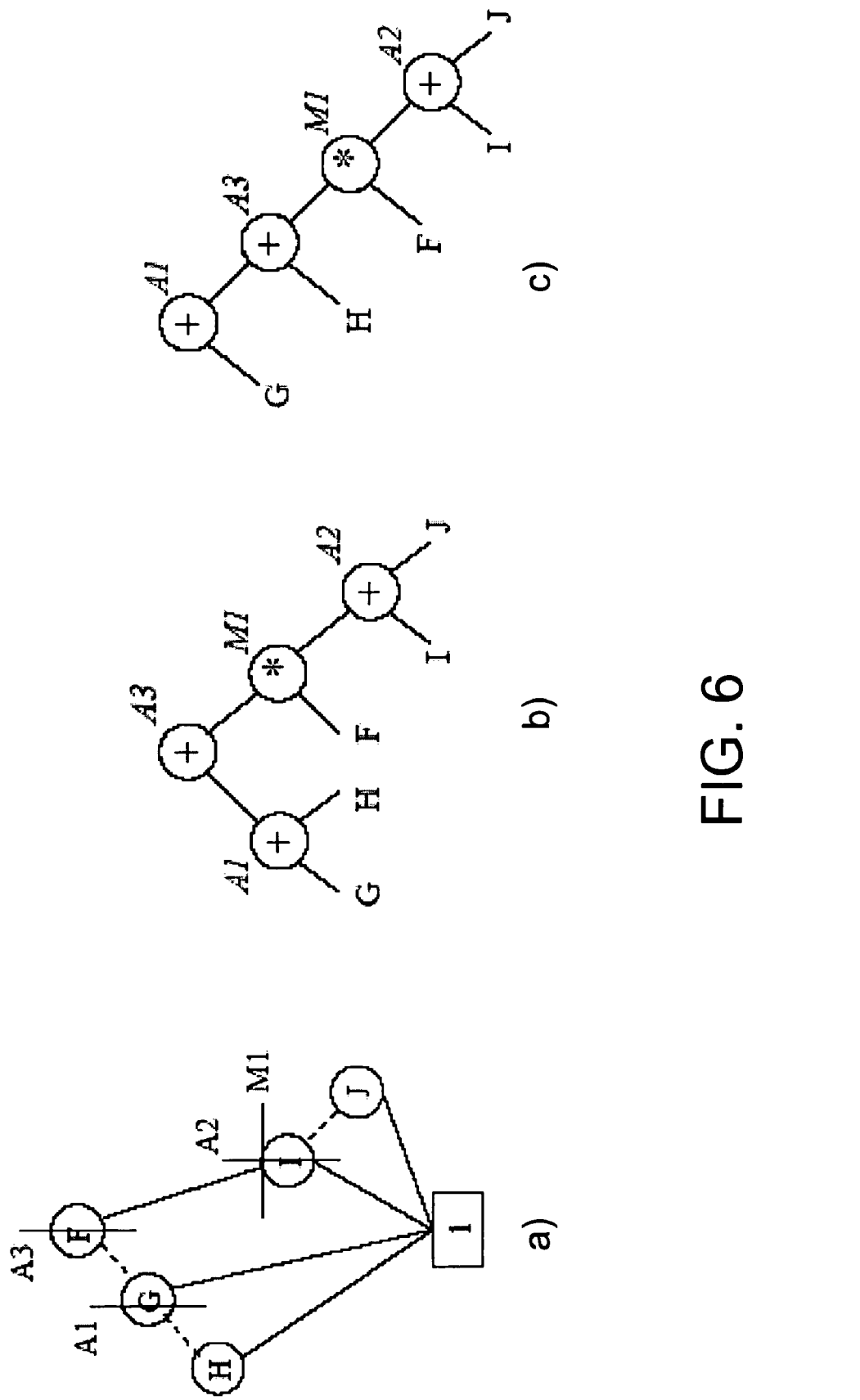
FIGS. 6a-6c illustrate DFG generation by cut-based TED decomposition, FIG. 6a showing cuts in the TED of SG2.

FIGS. 3a-3c illustrate common sub-expression extraction for a DCT transform of size 4; FIG. 3a showing the initial TED representation; FIG. 3b showing the TED after extracting $S1=(x0-x3)$ and $S2=(x0+x3)$; and FIG. 3c showing final TED after extracting $S3=(x1-x2)$ and $S4=(x1+x2)$. In the DCT in FIGS. 3a-3c, the matrix M has only four distinct coefficients, A, B, C, and D (for simplicity of exposition, all coefficients are treated as symbolic variables and no advantage is being taken of the fact that coefficient A=cos (0)=1).

$$M = \begin{vmatrix} \cos(0) & \cos(0) & \cos(0) & \cos(0) \\ \cos(\pi/8) & \cos(3\pi/8) & \cos(5\pi/8) & \cos(7\pi/8) \\ \cos(\pi/4) & \cos(3\pi/4) & \cos(5\pi/4) & \cos(7\pi/4) \\ \cos(3\pi/8) & \cos(7\pi/8) & \cos(\pi/8) & \cos(5\pi/8) \end{vmatrix} = \begin{vmatrix} A & A & A & A \\ B & C & -C & -B \\ D & -D & -D & D \\ C & -B & B & -C \end{vmatrix}$$

In its direct form, the computation for the DCT of size four involves sixteen multiplication and twelve addition operations. However, by recognizing the dependence between the coefficients of matrix M, it is possible to factorize the expressions and subsequently reduce the number of operations to six multiplications and eight additions. This is shown by the following equations:

$$F1 = A*((x0+x3)+(x1+x2))$$

$$F2 = B*(x0-x3)+C*(x1-x2)$$

$$F3 = D*((x0+x3)-(x1+x2))$$

$$F4 = C*(x0-x3)-B*(x1-x2)$$

The above factorization and simplification can be achieved by extracting sub-expressions (x0+x3), (x0−x3), (x1+x2), and (x1−x2), shared between the respective outputs, and substituting them with new variables. FIGS. 3a-3c show how this extraction can be achieved efficiently with a TED. The drawings in the figures are automatically generated by the software tool for TED factorization and common sub-expression extraction, developed as part of this invention, using the public domain package dot [reference].

The original TED constructed in Step 1 for the DCT example is shown in FIG. 3a. In Step 2, substitution S1=(x0−x3) takes place, which exposes another substitution, S2=(x0+x3), the locations being indicated by dashed lines labeled 115 in FIG. 3a. The result after the first two extractions and substitutions is shown in FIG. 3b. Variables x1, x2 are now in the bottom of the graph, exposing new common sub-expressions: (x1−x2) and (x1+x2), the locations being indicated by dashed lines labeled 116 and 117 in FIG. 3b. Subsequently, the next iteration of Steps 1 and 2 leads to substitutions S3=(x1−x2), and S4=(x1+x2), leading to the final TED shown in FIG. 3c.

The result of this extraction algorithm is a hierarchical TED graph composed of variables S1, S2, S3, and S4, each representing a sub-expression of the original function, and of the matrix coefficients. Each of those expressions will be represented by a local TED and used in the subsequent decomposition and optimization procedure, for the purpose of transforming the TED into a structural DFG representation.

The result of this TED-based factorization and common sub-expression elimination is the set of the following expressions:

$$S1=(x0-x3)$$

$$S2=(x0+x3)$$

$$S3=(x1-x2)$$

$$S4=(x1+x2)$$

$$F1=A*(S2+S4)$$

$$F2=B*S1+C*S3$$

$$F3=D*(S2-S4)$$

$$F4=C*S1-B*S3$$

This solution requires only six multiplications and eight additions.

Transformation of TED into DFG

Transformation of the functional TED representation into a structural DFG representation is obtained by performing a decomposition of the TED graph, and specifically by performing a series of disjunctive and conjunctive cuts on the TED nodes. Each time a cut is applied, a TED is decomposed into two subgraphs, and a hardware operator, adder (ADD) or multiplier (MULT), is introduced to perform the required operation on the two subgraphs. This way, functional TED representation is gradually transformed into a structural representation, Data Flow Graph, whose nodes represent hardware operators, and edges represent the input-output connections between the operators. The power of TED-based decomposition is that the resulting structure will represent not a single DFG, but a class of DFGs, equivalent in terms of the function they implement, but differing in final hardware implementation, performance and design area.

Hierarchical Decomposition

A starting point for the transformation of functional into structural representation of the design is a hierarchical TED. Such a TED is obtained by applying factorization, common sub-expression elimination and substitution described earlier, to the original (global) TED. Construction of the hierarchical TED is shown in FIGS. 4a-4d. SG1 and SG2 are the subgraphs extracted from the original TED, and K is a trivial subgraph corresponding to a single input variable. Each extracted sub-expression, stored as a TED (referred to as local TED) is then decomposed individually, resulting in an unscheduled local DFG. The results of the decomposition of the individual local TEDs are then combined to create a global DFG. This process is illustrated in FIGS. 5a-5b.

Cut-Based Decomposition

Figure 7:
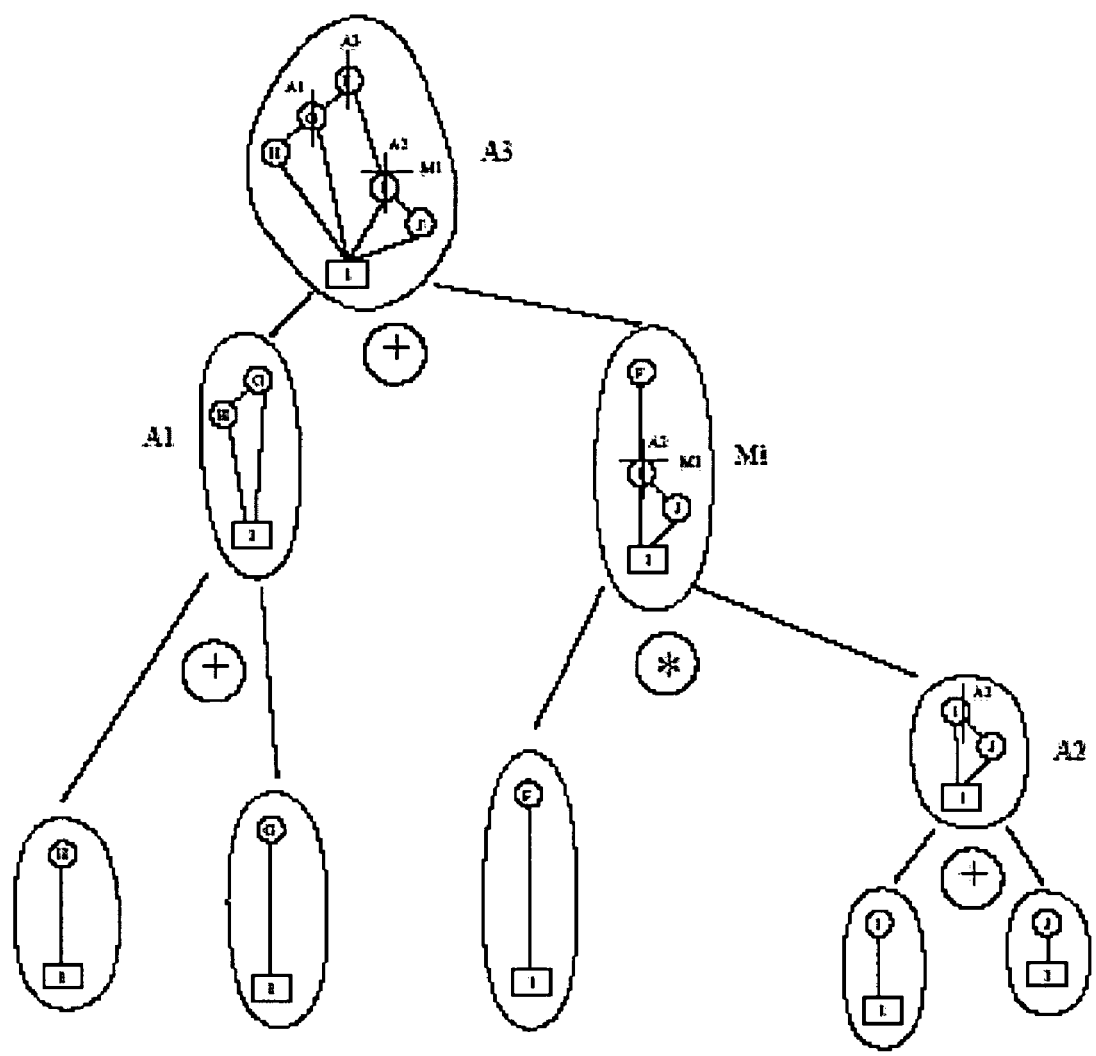
FIG. 7 illustrates an admissible decomposition sequence: {A3,M1,A2,A1}.

By construction, each node of a TED represents an expression associated with the subgraph rooted at that node. The value of that expression is computed as a sum of all the expressions along the paths that originate at that node. This additive property of a TED node is the basis of the cut-based disjunctive decomposition. Namely, splitting a node with two or more children edges decomposes the expression rooted at that node into two sub-expressions. Formally, the disjunctive (or additive) cut is defined as a cut that partitions the expression of the node into exactly two sub-expressions, each associated with one or more children edges, and in such a way that it does not increase the number of operations in the expression. The sum of the two sub-expressions produced by a disjunctive cut is then implemented with an adder (an ADD operator) in the hardware implementation. Additive cuts for the TED(SG2) in FIGS. 4a-4d are shown in FIG. 6a. Cut A3 partitions the root expression P=(G+H)+F(I+J) into (G+H) and F(I+J). Cut A1 partitions function (G+H) rooted at node G into two trivial sub-expressions, G and H, etc. A complete decomposition sequence for this TED is shown in FIG. 7.

If all the paths associated with a given expression pass through a single TED node, the expression can be represented as a conjunction of the expression above the node and the expression below the node. Such a node is referred to as a 1-dominator and defines a conjunctive cut on the TED. Formally, the conjunctive (or multiplicative) cut is defined as a cut that decomposes an expression into exactly two sub-expressions, whose product is equal to the original expression. It can be shown that such a cut requires the node to be 1-dominator. The product of the resulting two sub-expressions is then implemented with a multiplier (a MULT operator) in the final implementation.

Cut M1 in FIG. 6a is an example of a conjunctive (multiplicative) cut applicable to the subgraph Q=F(I+J) of the TED. Cut M1 decomposes this expression into two subgraphs, F and (I+J).

Given a set of cuts identified on a TED, the number of operations needed to implement the function is fixed and determined by the number of cuts. The TED in FIG. 6a requires three add operations, represented by disjunctive cuts A1, A2, A3, and one multiplication, represented by a conjunctive cut M1. The number of operations is irrespective of how the final DFG is structured, as shown in FIGS. 6b and 6c. Thus, cut-based decomposition eventually produces a data flow graph.

Admissible Cuts

The cut-based decomposition imposes partial ordering on the cuts. That is, the cuts must be applied in certain order during the decomposition process for it to generate valid decomposition into two-input arithmetic operators. Such sequences are called admissible. The cut is called admissible at a given phase of the decomposition process, if it meets the conditions imposed by the definition of the cut, stated above: it must produce exactly two sub-expressions that are composed disjunctively (A cuts) or conjunctively (M cuts), without increasing the total number of operations needed to implement the function.

Looking at FIGS. 6a, 6b, it is clear that cut M1 cannot be applied to the top level TED (SG2) until the TED is first decomposed disjunctively with cut A3, which generates subgraph Q=F(I+J). Conjunctive cut M1 then decomposes this expression into F and (I+J). Similarly, cut A2 cannot be applied to the graph, until M1 is applied, as it would violate the validity of the decomposition. Once cut M1 is applied, the resulting subgraph (I+J) can be decomposed disjunctively into trivial components, I and J.

Thus, TED decomposition is uniquely defined by a sequence of admissible cuts. The result of the decomposition is the data flow graph. Identifying and applying those cuts to a local TED constitutes the formal transformation from a TED (function) to a DFG (structure). The decomposition process identifies useful cuts and admissible cut sequences, selecting the best cut sequence for a given objective.

Effect of Ordering of Cuts on DFG Structure

The TED cuts defined above play a central role in transforming the functional representation of the design (the TED) into a structural representation (a DFG). It is one of the discoveries of this invention that different admissible cut sequences will, in general, produce different DFGs. The generation of a DFG that meets the designer constraints and optimizes the required objective is one of the objectives of this invention.

The transformation of TED into DFG is a recursive process. Starting with the original (local) TED, each (sub)expression is decomposed recursively until each of the resulting TED subgraphs trivially represents a single input variable. The resulting structure produces the required unscheduled, or partially scheduled, data flow graph (DFG). By choosing an appropriate sequence of cuts, the cut-based TED decomposition can be controlled to produce a DFG structure optimized for a particular objective. For example, if latency of the design needs to be minimized, a cut sequence is sought which results in a DFG with longest path having minimum length. To minimize power due to spurious computation, a well-balanced DFG needs to be produced, etc. The designer needs to develop metrics that will relate the resulting DFG structure to the particular optimization objective. This metric (cost of the solution) is used by the cut-based decomposition procedure to derive an optimum DFG structure. In general, each sequence of cuts will have a gain associated with it that reflects the chosen objective function; this gain will be used to guide the DFG optimization. FIGS. 6b and 6c show two data flow graphs obtained from a TED of SG2 component by applying different cut sequences. While it would also be possible to evaluate each cut separately, in the preferred embodiment, the algorithm finds a sequence of admissible cuts, and evaluates the sequence (i.e., an ordered set of cuts) which is faster and better.

Decomposition of Higher Order Polynomials

The following is a description of the decomposition of TEDs that represent polynomials of higher order (degree), often encountered in DSP applications. Typical expressions include quadratic and low order polynomials, such as $x^2-y^2$, or $(x+y)^3$, etc. The TED-based common sub-expression elimination, factorization and cut-based decomposition, described in this document, can be used to some extend for polynomials of higher degree. However, the TED structure does not directly reveal the possible decomposition into polynomials of lower degree, or into irreducible polynomials. For example, it is not apparent from the structural representation of function $x^2+2xy+y^2$ that it can be decomposed as $(x+y)^2$. Nor is it obvious that the function $(x^2-y^2)$ can be transformed into the function $(x+y)(x-y)$.

Horner's Form TED

Figure 8:
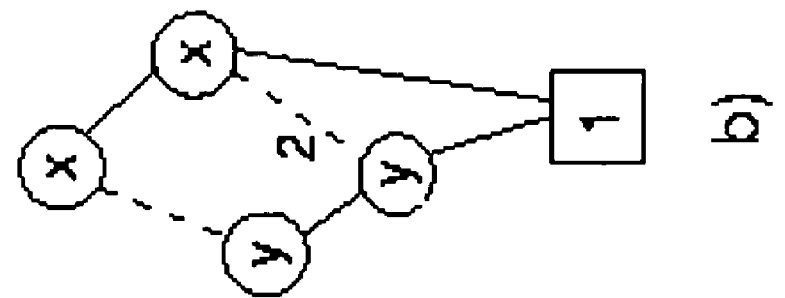
FIGS. 8a and 8b illustrate TED decomposition using Horner's form.
Figure 8:
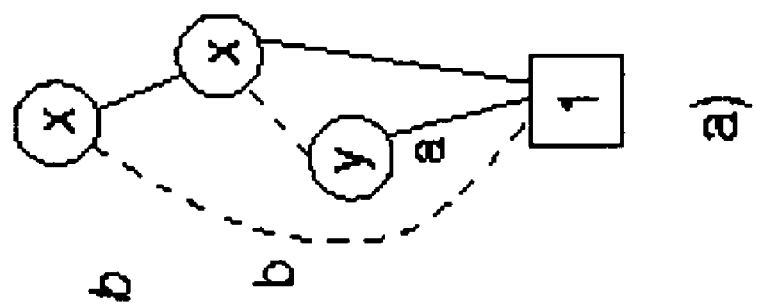

FIGS. 8a and 8b illustrate TED decompositions using Horner's form. Horner's form (a normal nested form) of a polynomial has been used to obtain decomposition of single-variable polynomials. In this arrangement, each variable appears in the graph as many times as the highest degree of that variable. For certain classes of polynomials, such as the polynomial $(x^2+a \cdot xy+b)$, Horner's form yields a useful factorization: $x(x+a \cdot y)+b$, as shown in FIG. 8a. However, Horner's decomposition is not useful for functions of the form $x^2+2xy+y^2$, shown in FIG. 8b, where it results in the form $x(x+2y)+y \cdot y$. This form does not reveal the most useful factorization, namely $(x+y)^2$.

It is desirable to represent high order polynomials as a product of linear polynomials, and Horner's form may be useful in some cases, as illustrated in FIG. 8a. Another method to achieve such factorization and decomposition of high degree polynomials into polynomials of lower degree involves the use of pattern matching.

Pattern Matching

Useful factorization of a TED can be obtained by recognizing certain structural patterns appearing in the graph, as illustrated in FIGS. 9a and 9b. Consider the following expression:

$$F=(x+k \cdot y)(x+m \cdot z)+l=x^2+(k \cdot y+m \cdot z)x+k \cdot m \cdot y \cdot z+l \quad (1)$$

FIGS. 9a and 9b illustrate TED decomposition into atomic structures. FIG. 9a shows the original TED for $F(x,y,z)=x^2+(ky+mz)x+km \cdot y \cdot z+l$. FIG. 9b shows TED factored out as $(x+k \cdot y)(x+m \cdot z)+l$.

Close examination of the structure of this graph, shown in FIG. 9a, shows that the subgraphs $F'(x=0)$, rooted at left node y, and $F(x=0)$, rooted at right node y, are dual with respect to each other. This structural duality is a result of the multiplication $(x+ky)(x+mz)$. Furthermore, the parallel edges of $F'(x=0)$ incident to nodes y and z are labeled with same coefficients k, m, as the serial multiplicative edges of $F(x=0)$, emanating from the respective nodes y and z of that subgraph. The duality between the two subtrees can be used to examine the decomposability of F into its irreducible polynomials $(x+k \cdot y)$ and $(x+m \cdot z)$. Since $F'(x=0)$ and $F(x=0)$ are linear functions of y,z, they can be written as:

$$F'(x=0)=ky+mz; F(x=0)=c(y \cdot z)+l \quad (2)$$

If the graphs $F'(x=0)$ and $F(x=0)$ are dual, and if $c=km$, then the function F can be factored out into the function $(x+k \cdot y)(x+m \cdot z)+l$, resulting in the graph shown in FIG. 9b. Both of these tests can be performed efficiently on the TED graph structure.

Another useful case is shown in FIGS. 10a-d which illustrates the decomposition of the polynomial expression $(x^2+p \cdot yx+q \cdot y^2)+w$. FIG. 10a depicts the original TED for the expression:

$$P=x^2+p \cdot yx+q \cdot y^2+w=(x+a \cdot y)(x+b \cdot y)+w. \quad (3)$$

In this case, the test for decomposability is to check if edge labels at nodes y satisfy condition:

$$p=a+b \text{ and } q=ab. \quad (4)$$

If this is true, the function can be represented in a diagram as shown in FIG. 10b. FIG. 10b shows the expression decomposed into $(x+ay)(x+by)+w$. Two special cases deserve attention, when $w=0$:

Case 1 (FIG. 10c):
$a+b=0$, which implies $a=-b$. In this case, $x^2-y^2=(x+y)(x-y)$ shown in FIG. 10c. There is no linear edge associated with x.

Case 2 (FIG. 1d):

a=b≠0, which gives $(x+ay)^2$, shown in FIG. 10d. This is a particularly interesting case, since the entire expression (subtree) can be represented as a power (such as ^2) of a smaller sub-expression, namely of (x+ay), as shown in FIG. 10d. The power of the sub-expression is indicated with a label assigned to the top edge of the subtree; we refer to such an edge as a power edge (analogous to complement edges in a BDD). Extension to polynomials of third order is straightforward. For polynomials of higher order, the difficulty lies in computing roots of such polynomials. Approximate methods to compute roots of such polynomials exist and can be used for the purpose of approximate decomposition and matching.

Experiments and Results

One prototype version of the TED package that has been implemented handles the following operations: construct a TED for a given set of expressions; perform dynamic ordering of variables (with several options); list a set of candidate expressions for extraction; factorize the expressions; extract all common sub-expressions using the algorithm described in Paragraph [0048]; print the final factorization; generate a drawing of the resulting TED; and many others. The tool can take as input a description of the design either in the matrix format (derived for example from Matlab or a similar system) or a behavioral HDL specification. For this reason, the tool has been interfaced with an architectural synthesis tool. By way of example, the architectural synthesis tool can be the academic synthesis software referred to as the GAUT architectural synthesis tool. See, for example, LESTER Universite de Bretagne Sud, GAUT, Architectural Synthesis Tool, http://lester.univ-ubs.fr:8080. The system parses the original behavioral-level HDL design, extracts the data flow graph (DFG), and produces an intermediate format. This format is used to create a TED data structure for the computation. Over a dozen of behavioral HDL specifications for practical DSP applications have been successfully converted to TED graphs.

Figure 11:
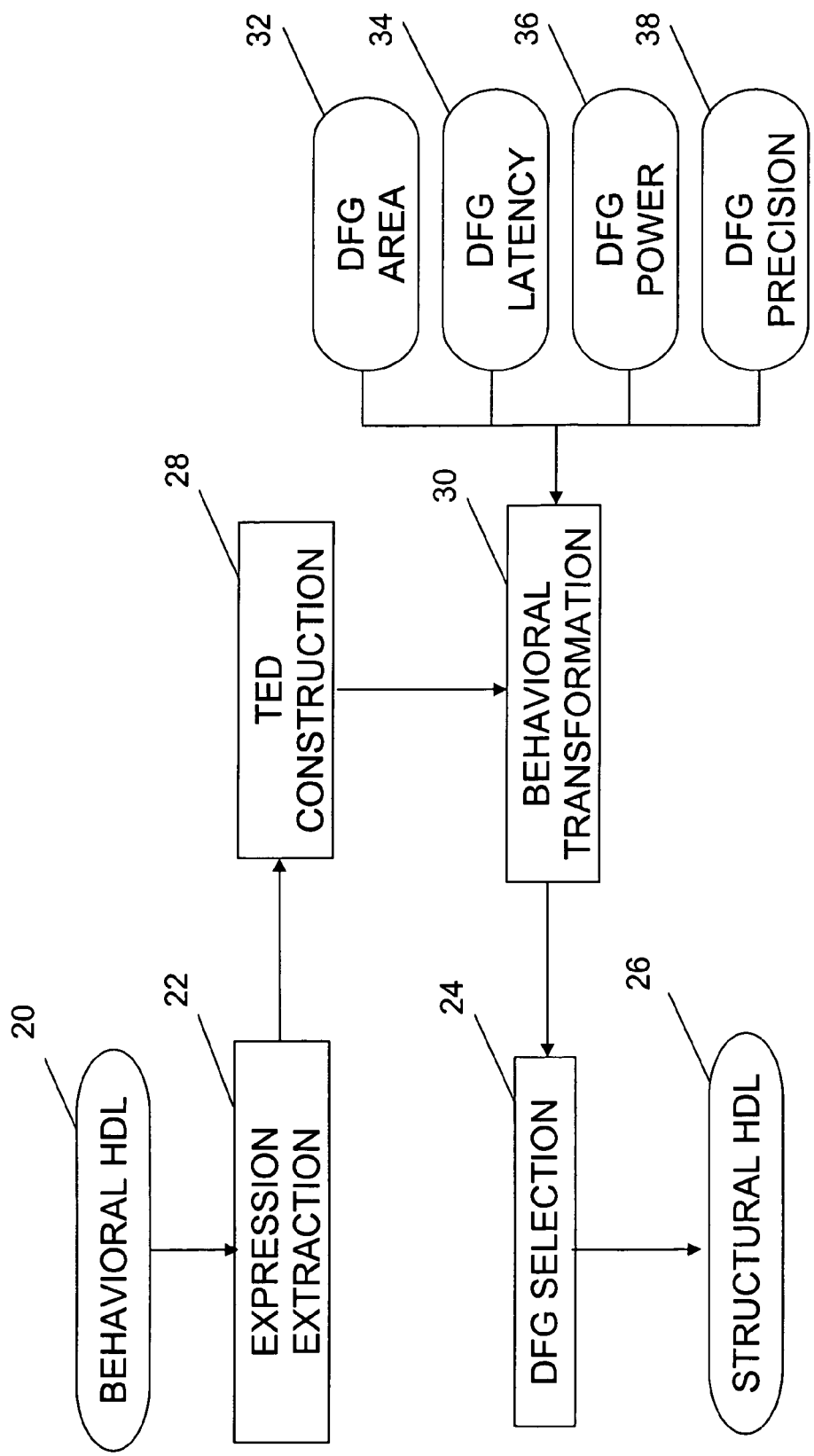
FIG. 11 is a process flow diagram for the method of providing behavioral synthesis based upon TED-based behavioral transformations in accordance with the present invention.

FIG. 11 illustrates the process for transforming a behavioral specification into a data flow structure optimized for a particular architectural optimization objective. In accordance with the invention, TED behavioral transformations are integrated with an architectural synthesis system, which can be the GAUT architectural synthesis tool, for example, or any other suitable architectural synthesis system. Referring to FIG. 11, the blocks 20, 22, 24 and 26 represent operations provided by the architectural synthesis system. The blocks 28 and 30 represent operations provided by a TED-based behavioral transformation layer that has been added to the basic synthesis flow in accordance with the invention. Blocks 32, 34, 36 and 38 represent objective functions, such as area, latency, power and precision, respectively, that can be used in the decomposition process in accordance with the present invention.

The original behavioral-level HDL design, block 20, is parsed, and the expression is extracted from the input specification, block 22, and stored in an intermediate format. This intermediate format is used by the TED construction and decomposition (blocks 28-38). Methods for TED construction are known in the art and applicants have developed and implemented software for this purpose as described in "Taylor Expansion Diagrams: A Compact Canonical Representation with Applications to Symbolic Verification," M. Ciesielski, P. Kalla, Z. Zeng, and B. Rouzeyre, in Design Automation and Test in Europe, DATE-02, 2002, pp. 285-289, and in "High-level Design Verification using Taylor Expansion Diagrams: First Results," by P. Kalla, M. Ciesielski, E. Boutillon, and E. Martin, in IEEE Intl. High Level Design Validation and Test Workshop, HLDVT-02, 2002, pp. 13-17, for example.

Figure 12A:
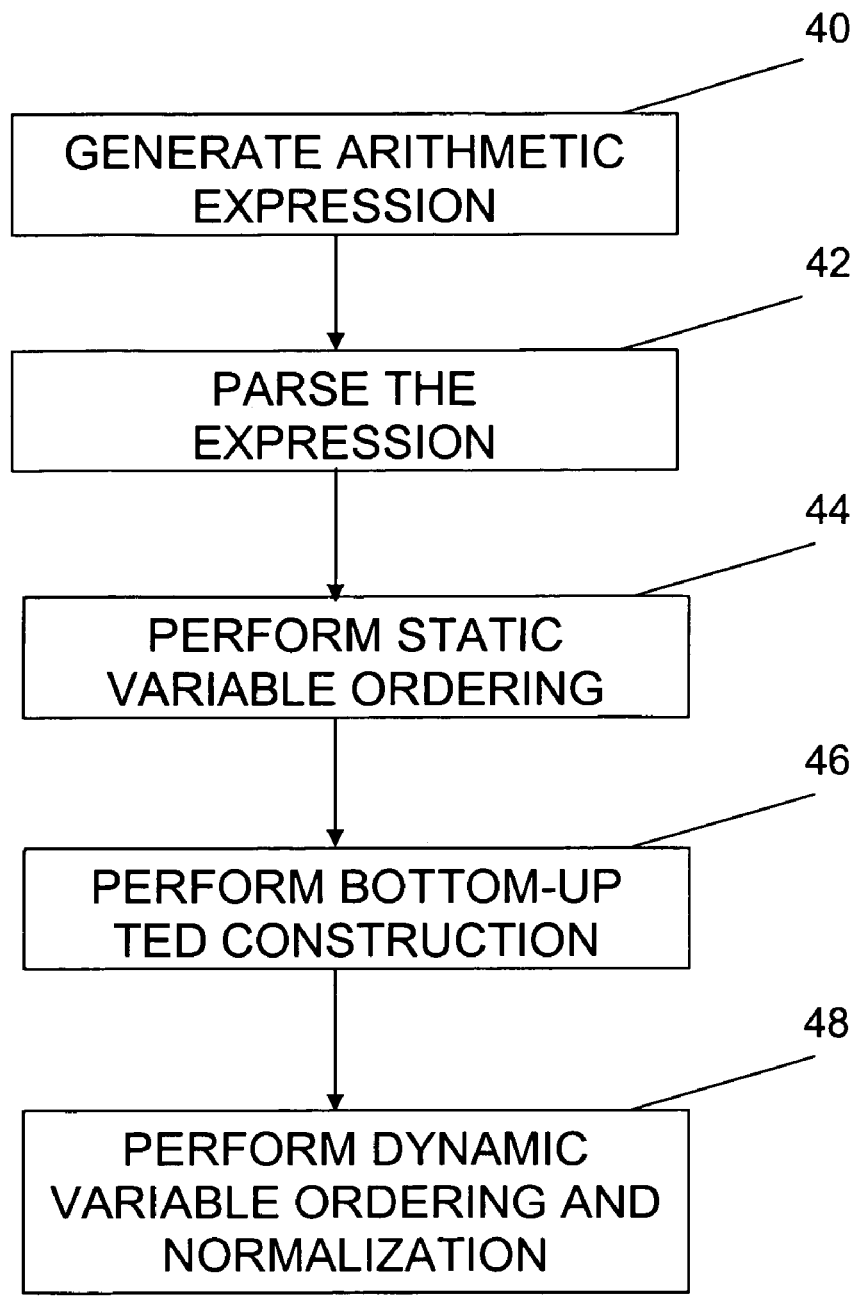

Referring to FIG. 12a, TED construction, block 28 in FIG. 11, is composed of the following functions illustrated in FIG. 12a. In block 40, the arithmetic expression is extracted from the initial specification (input). The resulting arithmetic expression is parsed, block 42, producing a parsing tree. Static variable ordering, based on analysis of the expression, is carried out, block 44, to minimize the initial size of TED. Then, bottom-up TED construction is performed, block 46. During the construction, a check is made every time a new sub-expression is generated, to determine if it already exists in the TED. If the current sub-expression does exist, it is linked to the existing function. Otherwise, a new sub-expression is constructed and added to the current TED. This process is known and used in the construction of BDDs. Then, normalization of the TED graph is performed, block 48, along with dynamic variable reordering, in the manner known in the art, which further minimizes the TED size. Decomposition of the resulting TED construction is performed by the behavioral transformation, block 30, FIG. 11.

Referring again to FIG. 11, with respect to the behavioral transformation, block 30, the decomposition is based on evaluating the cost of each cut sequence with respect to the given objective. The choice of the cut sequence depends on its cost, i.e., the gain that it offers in the decomposition. This determines which cut sequence is selected. The structure of the TED is used to guide a series of transformations, which include disjunctive cuts (A cuts) and conjunctive cuts (M cuts). Each cut sequence will have a gain associated with it that reflects the chosen objective function. In general, one objective function is used throughout the decomposition procedure, but a secondary objective can be used to distinguish between cut sequences with same primary objective.

Figure 12B:
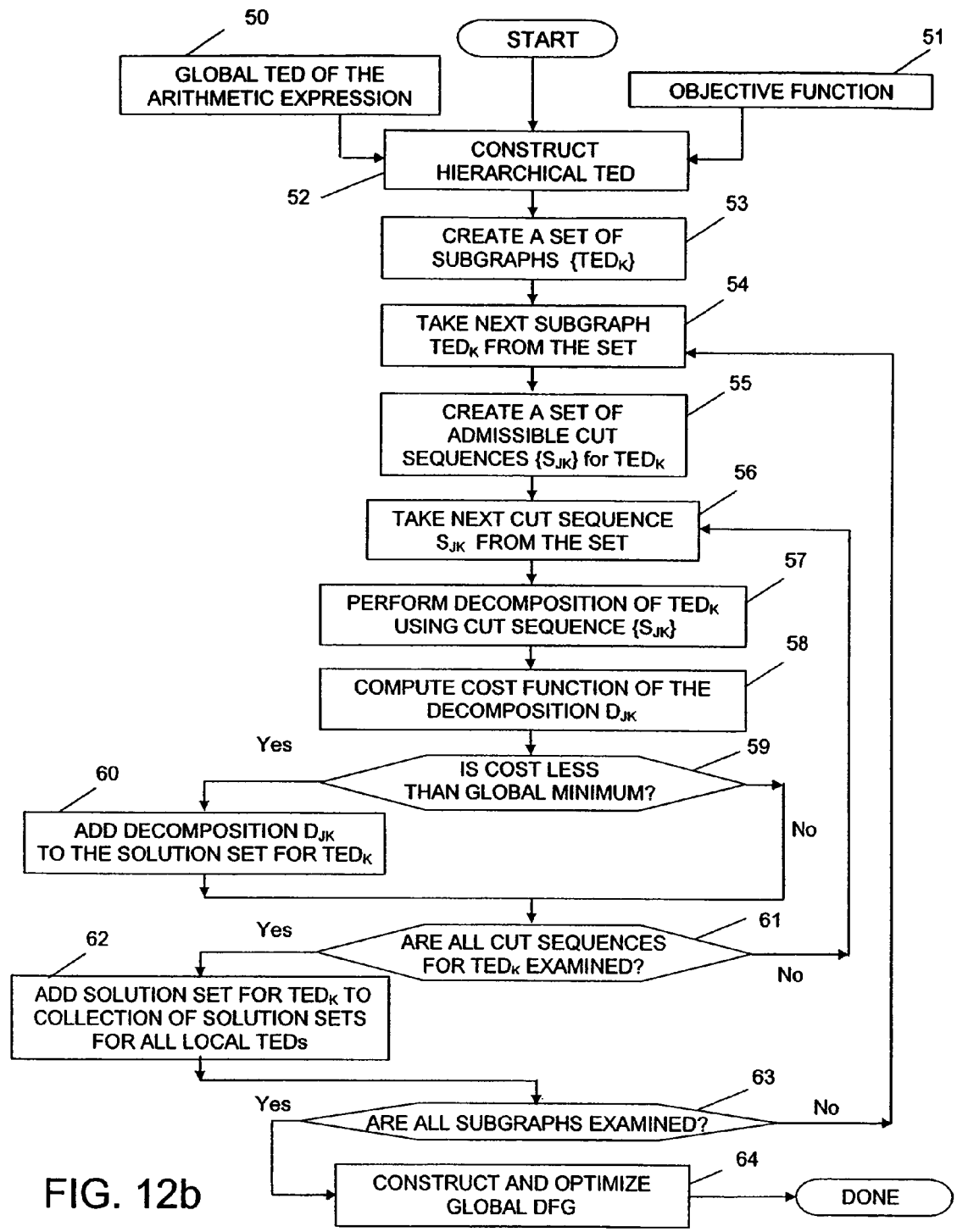
FIG. 12b is a process flow diagram for a method of providing behavioral transformation for the process of FIG. 11.

FIG. 12b provides a flowchart of the behavioral transformation functions of an arithmetic expression, represented as an initial TED (referred to as a global TED), block 50, produced by block 28 in FIG. 11. Referring also to FIG. 12b, behavioral transformations are composed of the following basic functions. In block 51, the objective function, provided by the designer, is read into the system. In block 52 a hierarchical TED is constructed from the global TED, by performing initial factorization and sub-expression extraction, using the algorithm described above in Paragraph [0048]. The subgraphs of the hierarchical TED are represented as local TEDs and collected in a separate set in block 53. The hierarchical TED is a reduced TED that is obtained by extracting sub-expression, where each node represents a smaller sub-expression, represented as a local TED. So a hierarchical TED has a "skeleton" with the nodes obtained by extraction and substitution, plus a local TED for each element or subgraph.

Block 54 starts a major iteration loop where each element or subgraph TEDk is decomposed and transformed into a set of local data flow graphs {DFGk}. First, in block 54 a subgraph TEDk is selected from the set of subgraphs. Decomposition is applied to each subgraph independently. In block 55 a set of admissible cut sequences {Sjk} is created for each TEDk using the procedure described in Paragraphs [0062]-[0063]. In block 56 another iteration loop starts that examines the admissible cut sequences for TEDk one by one. Using the cut sequence Sjk for TEDk, selected in block 56, the decomposition of the subgraph TEDk takes place in block 57. Cost function for this decomposition, denoted as Djk, is computed in block 58. The decision block 59 determines whether to accept the decomposition or to reject it, based on the adopted cost function. If the decomposition Djk based on cut Sjk is accepted, the flow proceeds to block 60, where the decomposition is added to the solution set for TEDk (each local TED will have several local decompositions to choose from in the global DFG solution), and continues to block 61. If the decomposition is rejected, the flow goes directly to block 61, where a check is made to determine if all admissible cut sequences for the subgraph TEDk have been considered. If this is not the case, the flow branches back to block 56, where the next sequence is selected for the subgraph. Otherwise, since there are no more cut sequences for TEDk, the current decomposition solution (in form of the data flow graph) for current TEDk is added to the collection of local DFGs for TEDk, in block 62. The flow then proceeds to block 63.

In block 63 a check is made to determine if all subgraphs have been examined and decomposed. If there are still subgraphs that have not been decomposed, the flow branches back to block 54, where the next subgraph TEDk is selected for decomposition. Otherwise, the data flow graphs obtained during the decomposition are composed to create a global DFG, which is optimized for a given objective function, block 64.

At the end of the flow global DFG is created from the set of decomposed TEDs, block 64. Referring to FIG. 11, the result of the decomposition is optimized in block 24, by selecting best DFG and generating the corresponding structural HDL description, block 26.

The objective functions, such as "design area", "delay", "latency", "power" and "computational precision" are related to characteristics of the chips being designed. They characterize the quality of the resulting implementation. These objectives are used by designers to evaluate the chip characteristics.

In the foregoing, the emphasis is on factorization and decomposition, but these terms are used in the general sense and are meant to include common sub-expression extraction, variable substitution, factorization, and expression simplification. For example, extraction of a TED subgraph rooted at a node pointed to by more than one edge can be viewed as a factorization or a common sub-expression extraction.

Figure 13A:
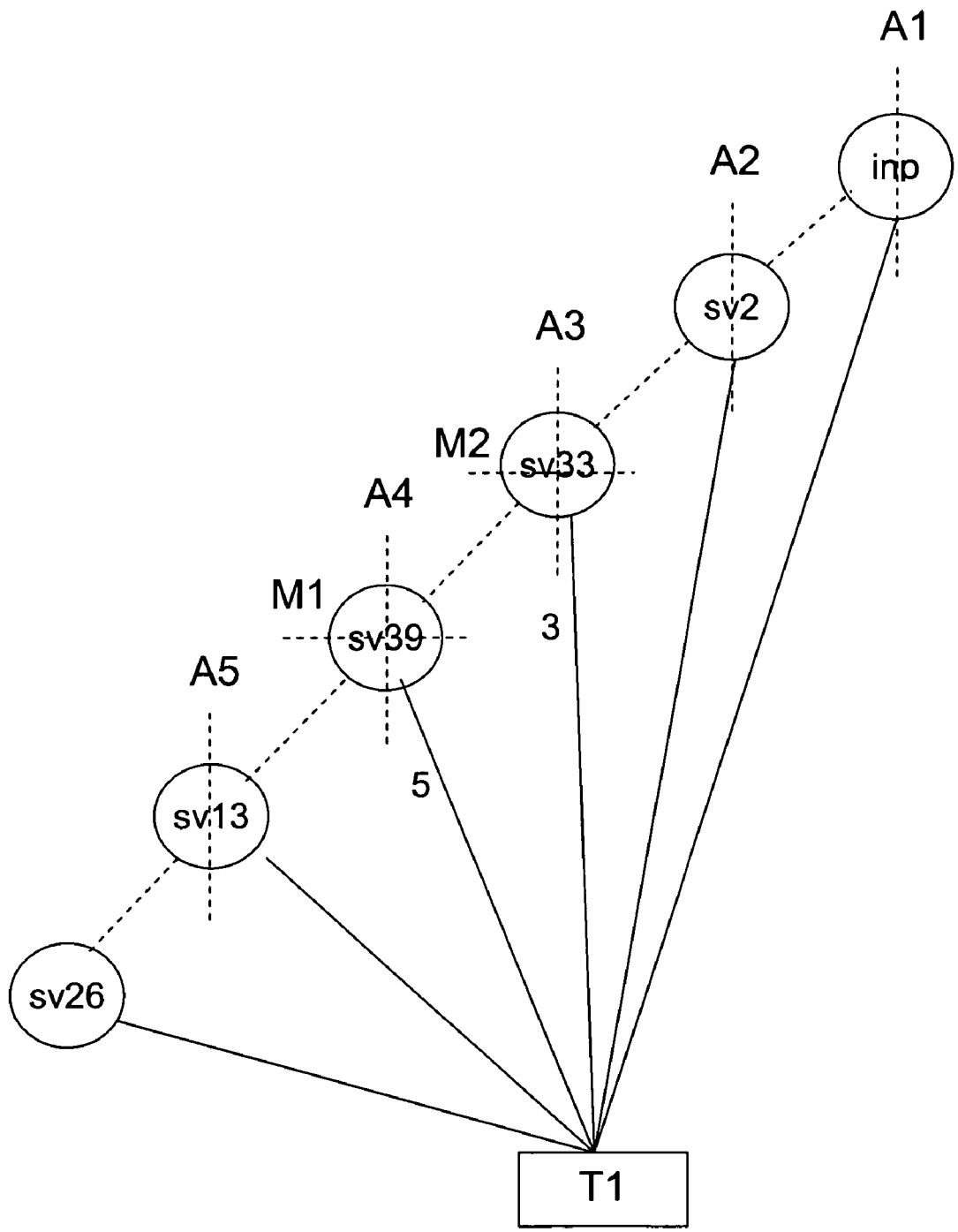
FIGS. 13a-13c show an example of the TED implementation obtained automatically from an architectural synthesis tool for an elliptic filter, with FIG. 13a showing the TED structure that is obtained automatically from behavioral HDL description.
Figure 13B:
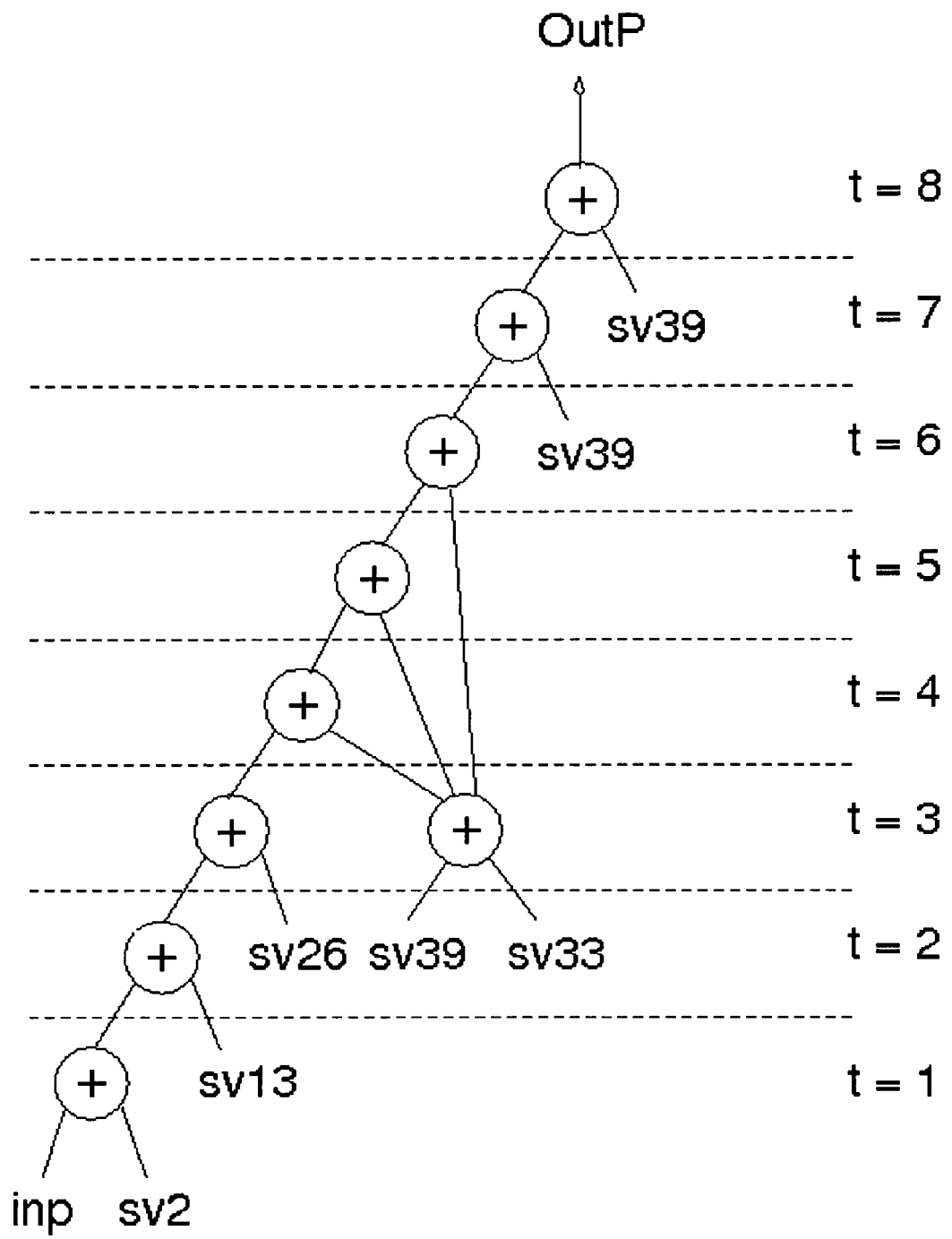
Figure 13C:
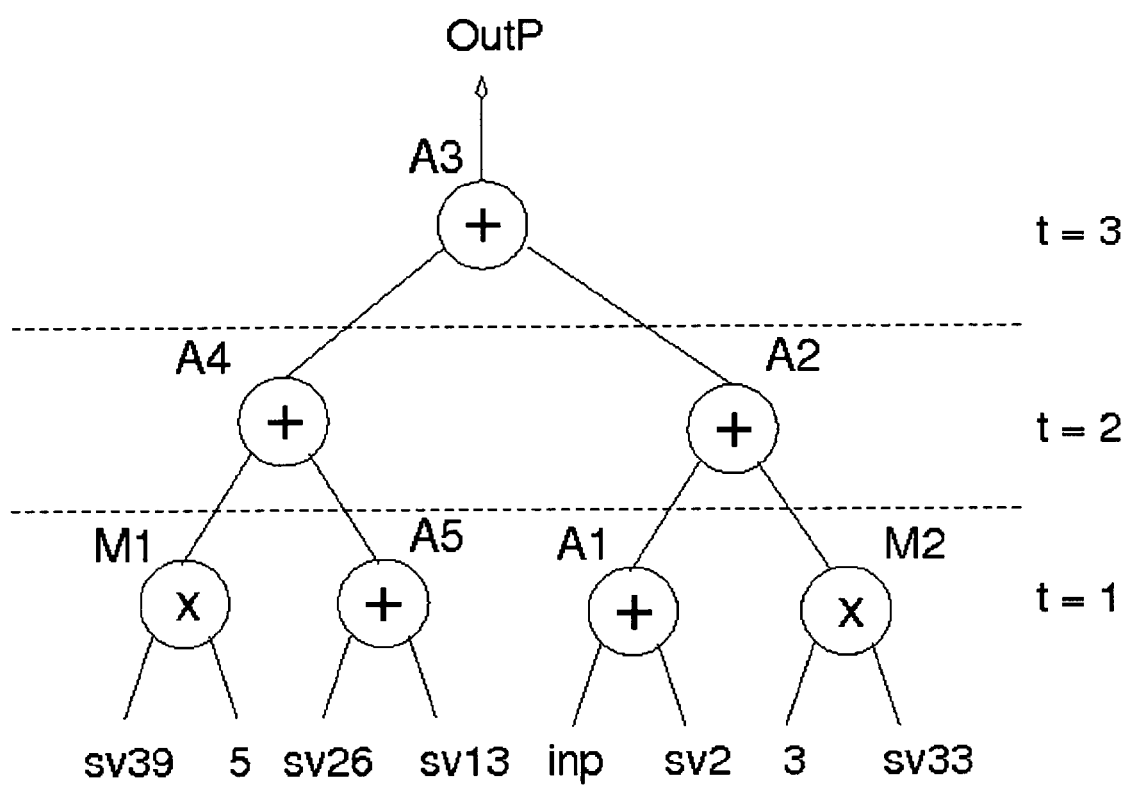

FIGS. 13*a*-13*c* illustrate an example of use of the method of the present invention in transformation of a behavioral specification for an elliptic filter into an optimized data flow structure. FIG. 13*a* shows the TED structure obtained automatically from behavioral HDL description. FIG. 13*b* shows the DFG for one of the outputs, Outp, obtained by GAUT. FIG. 13*c* shows the optimized DFG for output Outp obtained by TED decomposition. More specifically, FIG. 13*a* shows an example of the TED implementation obtained automatically from the system for an elliptic filter. The initial application of the proposed decomposition algorithms resulted in the reduction (with respect to an original data flow graph obtained by the system) in the number of operators from nine to seven, and the reduction in the tree height from eight to three, as shown in FIG. 13*b*; only output OutP is shown here for simplicity. Applicants have already obtained dozens of similar structures for practical DSP applications, ranging from FIR, to FFT, WHT, to LSM, etc.

The proposed method can be used for all computations that can be expressed as arithmetic expressions with finite Taylor expansion. The presented decomposition assumes mapping onto basic arithmetic datapath components, namely adders and multipliers. This is in contrast to the hardware mapping method proposed by A. Peymandoust and G. DeMicheli, in "Application of Symbolic Computer Algebra in High-Level Data-Flow Synthesis," *IEEE Trans. on Computer-Aided Design*, vol. 22, no. 9, pp. 1154-1165, September 2003, which is based on polynomial matching with arbitrary polynomials. In principle, however, the mapping onto arbitrary expression can also be handled by our method; it can be solved by dividing the original TED by the one representing the required "side relation". The division procedure for arbitrary TEDs has been already developed. Finally, the method can be extended to handle the combined data and control flow graph (CDFG) representations by introducing control/decision nodes into TED.

Figure 14:
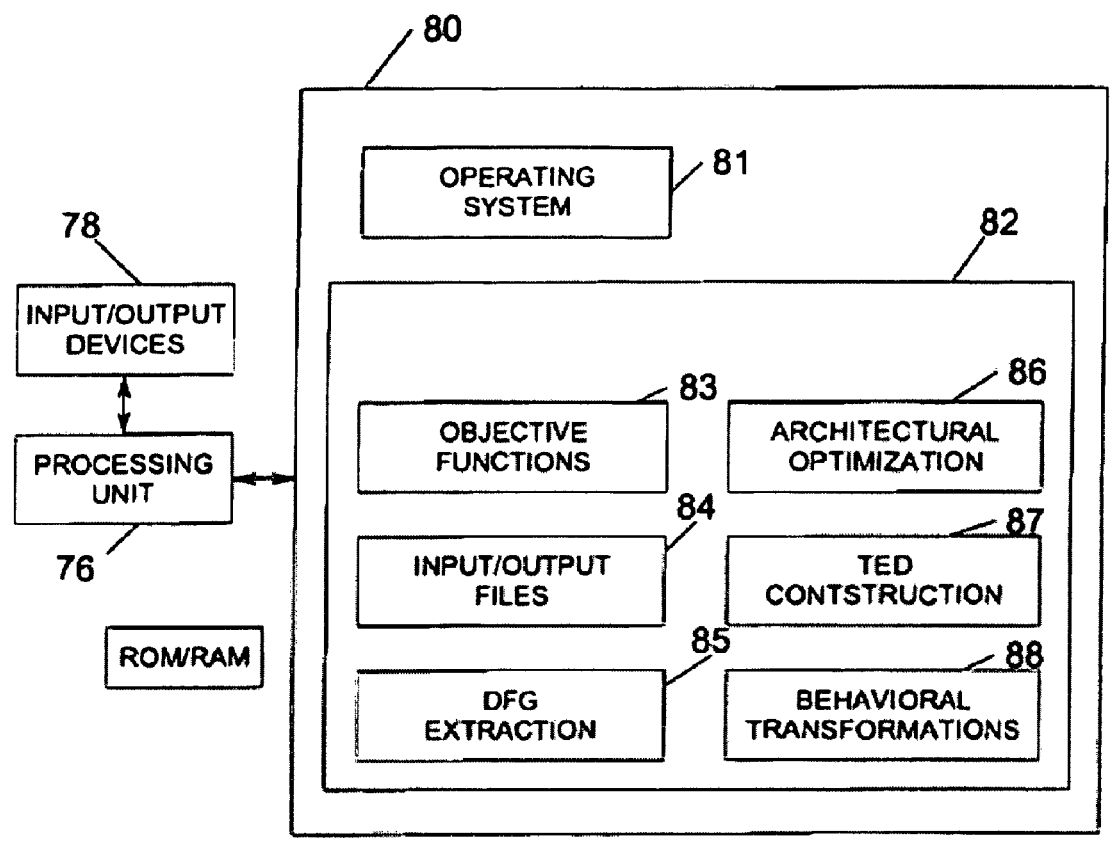
FIG. 14 is a block diagram of a processor for transforming a behavioral specification into a data flow structure, optimized for a particular architectural optimization objective in accordance with the present invention.

FIG. 14 is a block diagram of a processor or computer system 74 for transforming a behavioral specification into a data flow structure, optimized for a particular architectural optimization objective in accordance with the present invention. Referring to FIG. 14, the processor 74 includes a processing unit 76 having associated random access memory (RAM) and read only memory (ROM), input/output devices 78, such as a keyboard, CD and/or DVD drives, a display device, and a software platform 80 including data storage devices. In one embodiment, the software platform 80 includes an operating system 81 and a behavioral synthesis tool 82 including software programs and files which are used in carrying out transformation operations in accordance with the invention. In one embodiment, the behavioral synthesis tool 82 includes objective functions 83, input/output files 84, a DFG extraction engine 85, an architectural optimization engine 86, a TED construction engine 87, and a behavioral transformations engine 88. The programs and files of the computer system can also include or provide storage for data. The foregoing description of the processor or computer system 74 is by way of example only of one system for performing the transformation operations in accordance with the invention.

It may therefore be appreciated from the above detailed description of the preferred embodiment of the present invention that it provides a method and system for providing a systematic transformation of a behavioral specification into a data flow structure optimized for a particular architectural optimization objective. Taylor Expansion Diagrams (TEDs) are used as a canonical representation to explore a larger solution space for architectural optimization, guiding behavioral transformations to lead to efficient hardware implementations.

Although an exemplary embodiment of the present invention has been shown and described with reference to particular embodiments and applications thereof, it will be apparent to those having ordinary skill in the art that a number of changes, modifications, or alterations to the invention as described herein may be made, none of which depart from the spirit or scope of the present invention. All such changes, modifications, and alterations should therefore be seen as being within the scope of the present invention.

What is claimed is:

1. A method of transforming a behavioral-level specification into a data flow structure, said method comprising the steps of:
    representing the behavioral-level specification in a canonical data structure;
    performing a series of formal transformations on the canonical data structure by means of the decomposition of the canonical structure; and
    integrating the transformations with an architectural synthesis flow.

2. The method according to claim 1, wherein the step of performing a series of formal transformations on the canonical data structure includes the steps of performing common sub-expression extraction and/or factorization to reduce size of the canonical data structure and to enable a subsequent decomposition of the canonical data structure to produce data flow graphs.

3. The method according to claim 1, wherein Taylor Expansion Diagrams are used as the canonical data structure.

4. A method of transforming a behavioral specification of a design coded in a behavioral-level hardware description languages (HDL) design into a data flow structure, said method comprising the steps of:
  parsing an original behavioral-level HDL design;
  extracting a data flow graph to produce an intermediate format; and
  using the intermediate format obtained to create a global Taylor Expansion Diagram (TED) data structure for computation;
  performing common sub-expression extraction and/or factorization of a global Taylor Expansion Diagram to produce a hierarchical Taylor Expansion Diagram;
  performing decomposition of the global Taylor Expansion Diagram; and
  deriving optimized data flow graphs from the decomposition of the global Taylor Expansion Diagram.

5. The method according to claim 4, wherein the TED data structure creation includes the steps of
  constructing an arithmetic expression by extracting it from initial specifications;
  parsing the resulting arithmetic expression to produce a parsing tree;
  carrying out variable ordering to minimize size of the TED;
  for a the selected variable order, performing a bottom-up TED construction; and
  performing normalization of TED.

6. The method according to claim 5, further including performing decomposition of the normalized TED to transform a functional representation into a data flow graph following the bottom-up construction of the TED.

7. A method for behavioral transformation of a behavioral-level design and/or an analytical representation of the design for hardware synthesis and code optimization, said method comprising the steps of:
  extracting an arithmetic expression of the computation from the behavioral-level design or directly from the analytical representation;
  representing the arithmetic expression in a canonical data structure;
  performing common sub-expression extraction and/or factorization of the canonical data structure to produce a hierarchical canonical data structure;
  performing decomposition of the hierarchical canonical data structure;
  deriving optimized data flow graphs from the decomposition of the hierarchical canonical data structure; and
  coding the design obtained from the data flow graphs using standard architectural synthesis in a hardware description language.

8. The method according to claim 7, wherein the optimized data flow graphs comprise a family of equivalent data flow graphs.

9. The method according to claim 7, wherein the step of representing the arithmetic expression in a canonical data structure includes constructing a global Taylor Expansion Diagram representing the arithmetic expression.

10. The method according to claim 9, wherein the step of performing sub-expression extraction and/or factorization includes the steps of identifying common sub-expressions contained in the Taylor Expansion Diagram; extracting common sub-expressions by substituting a new variable for each sub-expression that is identified, and moving the new variable towards a top of the Taylor Expansion Diagram, producing the hierarchal Taylor Expansion Diagram.

11. The method according to claim 10, wherein the step of performing sub-expression extraction and/or factorization further includes the steps of identifying at least one bottom variable in the Taylor Expansion Diagram and moving a bottom variable towards the top of the Taylor Expansion Diagram after the common sub-expressions have been extracted in producing the hierarchal Taylor Expansion Diagram.

12. The method according to claim 10, wherein the step of performing decomposition of the hierarchical canonical data structure includes creating a plurality of subgraphs producing the hierarchal Taylor Expansion Diagram.

13. The method according to claim 12, wherein the step of performing decomposition of the hierarchical canonical data structure includes using cut-based decomposition to produce the plurality of subgraphs.

14. The method according to claim 13, wherein the step of performing decomposition of the hierarchical Taylor Expansion Diagram includes using an objective function, including at least one of area, latency, power, or precision, for guiding the decomposition process.

15. The method according to claim 7, wherein the analytical representation of the design is in form of a matrix or mathematical expression, including a polynomial expression.

16. A method of factoring and decomposing an arithmetic expression, said method comprising the steps of:
  representing the arithmetic expression in a canonical data structure;
  performing common sub-expression extraction and/or factorization of the canonical data structure to produce a hierarchical canonical data structure;
  performing decomposition of the hierarchical canonical data structure by decomposing subgraphs of the hierarchical canonical data structure; and
  deriving optimized data flow graphs from the decomposition of the hierarchical canonical data structure.

17. The method according to claim 16, wherein the optimized data flow graphs comprise a family of equivalent data flow graphs.

18. The method according to claim 16, wherein the step of representing the arithmetic expression in a canonical data structure includes constructing a global Taylor Expansion Diagram representing the arithmetic expression.

19. The method according to claim 18, wherein the step of performing sub-expression extraction and/or factorization includes the steps of identifying common sub-expressions contained in the Taylor Expansion Diagram, extracting the common sub-expressions by substituting a new variable for each sub-expression that is identified, and moving the new variable towards a top of the Taylor Expansion Diagram, producing a hierarchical Taylor Expansion Diagram.

20. The method according to claim 19, wherein the step of performing sub-expression extraction and/or factorization further includes the steps of identifying at least one bottom variable in the Taylor Expansion Diagram, and moving a bottom variable towards the top of the Taylor Expansion Diagram after the common sub-expressions have been extracted in producing the hierarchical Taylor Expansion Diagram.

21. The method according to claim 20, wherein the step of performing decomposition of the hierarchical canonical data structure includes creating a plurality of subgraphs constituting the hierarchal Taylor Expansion Diagram.

22. The method according to claim 20, wherein the step of performing decomposition of the hierarchical canonical data structure includes using cut-based decomposition to create a plurality of subgraphs.

23. The method according to claim 22, wherein decomposition is applied to each subgraph independently.

24. The method according to claim 16, wherein the step of performing decomposition of the hierarchical canonical data structure includes using an objective function, including at least one of area, latency, power, or precision, for guiding the decomposition process.

25. The method according to claim 24, wherein the step of decomposing the canonical data structure into a data flow graph includes the steps of:
(a) identifying useful cuts and admissible cut sequences;
(b) selecting a the best cut sequence for the given objective, including identifying cuts and computing cost of cuts;
(c) performing a decomposition of the canonical data structure for the selected cut sequence, forming a decomposed portion of the canonical data structure;
(d) reordering the resulting sub-expressions using variable ordering directly on the canonical data structure;
(e) repeating steps (a)-(d) for each decomposed part until all cuts have been made; and
(f) creating a corresponding data flow graph, uniquely defined by the sequence of cuts applied.

26. A method of factoring and decomposing an arithmetic expression, said method comprising the steps of:
constructing a global Taylor Expansion Diagram representing the arithmetic expression;
performing common sub-expression extraction and/or factorization of the global Taylor Expansion Diagram to produce a hierarchical Taylor Expansion Diagram;
performing decomposition of the global Taylor Expansion Diagram; and
deriving optimized data flow graphs from the decomposition of the global Taylor Expansion Diagram.

27. The method according to claim 26, wherein the optimized data flow graphs comprise a family of equivalent data flow graphs.

28. The method according to claim 26, wherein the step of performing sub-expression extraction and/or factorization includes the steps of identifying common sub-expressions contained in the Taylor Expansion Diagram; extracting the common sub-expressions by substituting a new variable for each sub-expression that is identified, producing a hierarchical Taylor Expansion Diagram.

29. The method according to claim 28, wherein an order of variables of the hierarchical Taylor Expansion Diagram thus obtained is changed to exhibit new potential factorization.

30. The method according to claim 28, wherein the new variables thus created are moved towards the top of a Taylor Expansion Diagram.

31. The method according to claim 27, wherein the step of performing sub-expression extraction and/or factorization further includes the steps of identifying at least one bottom variable in the Taylor Expansion Diagram, and moving the bottom variable towards a top of the Taylor Expansion Diagram after a common sub-expressions have been extracted in producing a hierarchical Taylor Expansion Diagram.

32. The method according to claim 26, wherein the step of performing decomposition of the global Taylor Expansion Diagram includes creating a plurality of subgraphs producing the hierarchal Taylor Expansion Diagram.

33. The method according to claim 32, wherein the step of performing decomposition of the global Taylor Expansion Diagram includes using cut-based decomposition to produce the plurality of subgraphs.

34. The method according to claim 26, wherein the step of decomposing the global Taylor Expansion Diagram includes using an objective function, including at least one of area, latency, power, or precision, for guiding the decomposition process.

35. A method of decomposing a canonical representation of an arithmetic expression into a plurality of data flow graphs using a cut-based decomposition, said method comprising the steps of:
(a) identifying useful cuts and admissible cut sequences;
(b) selecting an objective function, including at least one of area, latency, power, or precision, for guiding the decomposition process;
(c) selecting a best cut sequence for the selected objective function, including identifying cuts and computing cost of the cuts;
(d) performing a decomposition of the canonical data structure for the selected cut sequence;
(e) reordering the resulting sub-expressions using variable ordering directly on canonical data structure;
(f) repeating steps (a)-(e) for each decomposed part until all cuts have been made; and
(g) creating a corresponding data flow graph.

* * * * *